(12) United States Patent
Kitabatake et al.

(10) Patent No.: US 10,100,249 B2
(45) Date of Patent: Oct. 16, 2018

(54) PHOSPHOR AND METHOD FOR MANUFACTURING THE SAME

(71) Applicant: Samsung Electronics Co., Ltd., Suwon-si (KR)

(72) Inventors: Takuya Kitabatake, Yokohama (JP); Fusaki Fujibayashi, Yokohama (JP); Hiroko Endo, Yokohama (JP); Masahide Yamada, Yokohama (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/353,062

(22) Filed: Nov. 16, 2016

(65) Prior Publication Data

US 2017/0137708 A1 May 18, 2017

(30) Foreign Application Priority Data

Nov. 16, 2015 (JP) .................. 2015-223710

(51) Int. Cl.
*C09K 11/08* (2006.01)
*C09K 11/59* (2006.01)
(Continued)

(52) U.S. Cl.
CPC ...... *C09K 11/7734* (2013.01); *C01B 21/0602* (2013.01); *C04B 35/584* (2013.01);
(Continued)

(58) Field of Classification Search
CPC ............ C09K 11/7734; C09K 11/7792; C09K 11/0883; H01L 33/502
See application file for complete search history.

(56) References Cited

U.S. PATENT DOCUMENTS 6,717,353 B1 4/2004 Mueller et al.
7,045,905 B2 * 5/2006 Nakashima ....... H01L 23/49562
257/100
(Continued)

FOREIGN PATENT DOCUMENTS

DE 10 2008 058 295 A1 5/2010
JP 2011-515536 A 5/1992
(Continued)

OTHER PUBLICATIONS

Piao, Xianqing, et al. "Synthesis of Nitridosilicate CaSr1—x Eu x Si5N8 (x=0-1) Phosphor by Calcium Cyanamide Reduction for White Light-Emitting Diode Applications." Journal of The Electrochemical Society 155.1 (2008): J17-J22.

(Continued)

*Primary Examiner* — C Melissa Koslow
(74) *Attorney, Agent, or Firm* — NSIP Law

(57) ABSTRACT

A phosphor includes a nitride including an alkaline-earth metal element, silicon, and an activator element, wherein the phosphor has a volume average particle diameter ranging from about 50 nm to about 400 nm, and an internal quantum efficiency of greater than or equal to about 60% at an excitation wavelength of 450 nm, the phosphor is represented by a formula $M_2Si_5N_8$, the M includes one or more alkaline-earth metal element selected from Ca, Sr, Ba, and Mg and including at least Sr, and one or more activator element selected from Eu and Ce and including at least Eu, an amount of the Sr included in the phosphor is about 15 mol % to about 99 mol % based on total moles of the M, and an amount of the activator element included in the phosphor is about 1 mol % to 20 mol % based on the total moles of the M.

8 Claims, 13 Drawing Sheets

(51) Int. Cl.
  *H01L 33/00* (2010.01)
  *C09K 11/77* (2006.01)
  *C04B 35/584* (2006.01)
  *C01B 21/06* (2006.01)
  *C04B 35/626* (2006.01)
  *H01L 33/50* (2010.01)

(52) U.S. Cl.
  CPC ...... *C04B 35/6268* (2013.01); *C09K 11/0883* (2013.01); *C09K 11/7792* (2013.01); *C04B 2235/3208* (2013.01); *C04B 2235/3213* (2013.01); *C04B 2235/3224* (2013.01); *C04B 2235/3873* (2013.01); *C04B 2235/549* (2013.01); *C04B 2235/5445* (2013.01); *C04B 2235/5454* (2013.01); *H01L 33/502* (2013.01)

(56) References Cited

U.S. PATENT DOCUMENTS

| | | | |
|---|---|---|---|
| 7,258,816 B2 * | 8/2007 | Tamaki | C01B 21/0602 252/301.4 F |
| 7,297,293 B2 | 11/2007 | Tamaki et al. | |
| 7,556,744 B2 | 7/2009 | Tamaki et al. | |
| 7,597,823 B2 | 10/2009 | Tamaki et al. | |
| 7,964,113 B2 | 6/2011 | Tamaki et al. | |
| 8,058,793 B2 | 11/2011 | Tamaki et al. | |
| 8,076,847 B2 | 12/2011 | Tamaki et al. | |
| 8,277,687 B2 | 10/2012 | Takahashi et al. | |
| 8,808,578 B2 | 8/2014 | Izawa et al. | |
| 8,884,513 B2 | 11/2014 | Izawa et al. | |
| 8,896,006 B2 | 11/2014 | Becker et al. | |
| 8,961,827 B2 | 2/2015 | Izawa et al. | |
| 9,856,418 B2 * | 1/2018 | Kitabatake | C09K 11/7792 |
| 2008/0081011 A1 * | 4/2008 | Oshio | C04B 35/597 423/263 |
| 2011/0135928 A1 | 6/2011 | Ravilisetty et al. | |
| 2014/0320787 A1 | 10/2014 | Izawa et al. | |
| 2016/0053170 A1 | 2/2016 | Okura et al. | |
| 2016/0272886 A1 | 9/2016 | Ueda et al. | |

FOREIGN PATENT DOCUMENTS

| | | |
|---|---|---|
| JP | 2003-336050 A | 11/2003 |
| JP | 2007-314726 A | 12/2007 |
| JP | 2008-50379 A | 3/2008 |
| JP | 2012-241028 A | 12/2012 |
| JP | 2015-953 A | 1/2015 |
| JP | 2015-124305 A | 7/2015 |
| JP | 2015-218315 A | 12/2015 |
| KR | 10-2010-0128336 A | 12/2010 |
| KR | 10-2011-0086861 A | 8/2011 |
| KR | 10-2013-0109333 A | 10/2013 |
| KR | 10-2015-0133702 A | 11/2015 |
| KR | 10-2015-0136091 A | 12/2015 |
| WO | WO 01/40403 A1 | 6/2001 |

OTHER PUBLICATIONS

Bulloni, Claudio, et al. "Effect of Ca 2+ codoping on the Eu 2+ luminescence properties in the Sr 2 Si 5 N 8 host lattice: a theoretical approach." Physical Chemistry Chemical Physics 17.38 (2015): 24925-24930.

Extended European Search Report dated Apr. 5, 2017 in corresponding European Patent Application No. 16198124.6 (11 pages).

* cited by examiner

PHOSPHOR AND METHOD FOR MANUFACTURING THE SAME

CROSS-REFERENCE TO RELATED APPLICATIONS

This application claims the benefit under 35 USC 119(a) of Japanese Patent Application No. 2015-223710 filed on Nov. 16, 2015, in the Japan Patent Office, the entire disclosure of which is incorporated herein by reference for all purposes.

BACKGROUND

1. Field

This application relates to a phosphor and a method for manufacturing the phosphor.

2. Description of Related Art

Recently, a phosphor capable of performing a photoconversion has been built in a light emitting device such as LED lighting, a display, and other light emitting devices.

For example, in the LED lighting, development of coating a semiconductor chip with the phosphor has been made by adding in a dropwise fashion a dispersion of the phosphor inside a silicone resin or other medium on an InGaN-based semiconductor chip emitting light close to blue light or ultraviolet light, which is regarded to be promising as an excitation light source.

Light emitted from the phosphor excited by light emitted from the InGaN-based semiconductor modifies the color or tone of light emitted from the LED lighting.

The photoluminescence characteristics of the phosphor play a very important role in terms of characteristics of the light emitting device. In other words, the characteristics of the light emitting device are determined by the photoluminescence characteristics of the phosphor performing the photoconversion.

Currently, such light emitting devices mainly use a phosphor excited by visible light, for example, $Y_3Al_{12}O_5$:Ce emitting yellow light, $CaAlSiN_3$:Eu emitting red light, and other phosphors excited by visible light and emitting various colors of light. Such phosphors are known to have the best photoluminescence characteristics when their particle diameter is within a range of several μm to tens of μm.

On the other hand, a phosphor particulate having an average particle diameter of less than 1 μm lacks a crystalline structure and has many defects, causing a large deterioration in luminance due to insufficient dispersion of an activator element, and is known to be inappropriate for a light emitting device generally using an LED and a phosphor such as lighting, a display, or other light emitting device.

However, the phosphor particulate having an average particle diameter of less than about 1 μm has recently been in increasing demand for various uses. For example, when applied to a conventional fluorescent lamp, the phosphor particulate having an average particle diameter of less than about 1 μm exhibits an excellent coating performance compared to a phosphor having an average particle diameter of tens of μm. In addition, when applied to an LED lighting package, excellent dispersity, a small load, and improved photodispersity may be obtained compared with the phosphor having an average particle diameter of tens of μm.

However, the luminous efficiency of an oxynitride phosphor particulate or a nitride phosphor particulate having an average particle diameter of less than about 1 μm needs to be improved to match the luminance efficiency of a phosphor generally used for an LED lighting package. Accordingly, research on improving the nephelauxetic effects of the phosphor particulate is ongoing. Specifically, to maximize the nephelauxetic effects by sufficiently increasing crystal field splitting in an activator ion such as Eu2+, Ce3+, or other activator ion, the oxynitride phosphor particulate or the nitride phosphor particulate should contain a nitrogen anion.

However, a phosphor can be currently manufactured to have an average particle diameter of several μm to tens of μm, but a phosphor particulate having an average particle diameter of less than about 1 μm and a method of preparing the same for a high performance light emitting device or a method of manufacturing the same have not yet been developed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a phosphor includes a nitride, and the nitride includes an alkaline-earth metal element, silicon, and an activator element; wherein the phosphor has a volume average particle diameter ranging from about 50 nm to about 400 nm, and an internal quantum efficiency of greater than or equal to about 60% at an excitation wavelength of 450 nm; the phosphor is represented by a formula $M_2Si_5N_8$; the M includes one or more alkaline-earth metal element selected from Ca, Sr, Ba, and Mg and including at least Sr, and one or more activator element selected from Eu and Ce and including at least Eu; an amount of the Sr included in the phosphor is about 15 mol % to about 99 mol % based on total moles of the M; and an amount of the activator element included in the phosphor is about 1 mol % to 20 mol % based on the total moles of the M.

The nitride may have a same crystal structure as a material represented by a formula $Sr_2Si_5N_8$.

The phosphor may further include a silicon-containing compound having a crystal structure that is different from the crystal structure of the nitride; and an amount of the nitride included in the phosphor may be greater than or equal to about 50 mass % based on a sum of a mass of the nitride and a mass of the silicon-containing compound.

The phosphor may have a volume average particle distribution index ranging from about 1.20 to about 1.35.

In another general aspect, a method of manufacturing a phosphor, the phosphor including a nitride, the nitride including an alkaline-earth metal element, silicon, and an activator element, the method including preparing a phosphor precursor particle including a silicon nitride particle, an alkaline-earth metal element-containing compound deposited on a surface of the silicon nitride particle, and an activator element-containing compound deposited on the surface of the silicon nitride particle; and firing the phosphor precursor particle; wherein a volume average particle diameter of the phosphor precursor particle is less than or equal to about 250 nm.

The preparing of the phosphor precursor particle may include applying a wet chemical process to a suspension liquid including the silicon nitride particle, a material including an alkaline-earth metal element, and a material including an activator element to form a phosphor precursor particle in which the alkaline-earth metal element-containing compound and the activator element-containing compound are mixed and deposited on the surface of the silicon nitride particle.

The wet chemical process may be either one or both of a co-precipitation method and a citrate method.

The wet chemical process may be the co-precipitation method.

The alkaline-earth metal element-containing compound deposited on the surface of the silicon nitride particle may include one or more alkaline-earth metal element selected from Ca, Sr, Ba, and Mg and including at least Sr; the activator element-containing compound deposited on the surface of the silicon nitride particle may include one or more activator element selected from Eu and Ce and including at least Eu; in the phosphor precursor particle, a mole ratio of a total mole amount of the alkaline-earth metal element and the activator element to a mole amount of the silicon in the silicon nitride particle ranges from about 1:1 to about 1:1.6; an amount of the Sr included in the phosphor precursor particle is about 15 mol % to about 99 mol % based on a total mole amount of the alkaline-earth metal element and the activator element; and an amount of the activator element included in the phosphor precursor particle is about 1 mol % to about 20 mol % based on the total mole amount of the alkaline-earth metal element and the activator element.

The preparing of the phosphor precursor particle may include preparing a suspension liquid including the silicon nitride particle, a material including one or more alkaline-earth metal element selected from Ca, Sr, Ba, and Mg and including at least Sr, and a material including one or more activator element selected from Eu and Ce and including at least Eu; and applying a wet chemical process to the suspension liquid to precipitate the alkaline-earth metal element-containing compound and the activator element-containing compound from the suspension liquid onto the surface of the silicon nitride particle to form a phosphor precursor particle in which the alkaline-earth metal element-containing compound and the activator element-containing compound are mixed and deposited on the surface of the silicon nitride particle; wherein in the phosphor precursor particle, a mole ratio of a total mole amount of the alkaline-earth metal element and the activator element and a mole amount of the silicon in the silicon nitride particle ranges from about 1:1 to about 1:1.6; an amount of the Sr included in the suspension liquid is about 15 mol % to about 99 mol % based on a total mole amount of the alkaline-earth metal element and the activator element; and an amount of the activator element included in the suspension liquid is about 1 mol % to about 20 mol % based on the total mole amount of the alkaline-earth metal element and the activator element.

The wet chemical process may be either one or both of a co-precipitation method and a citrate method.

The wet chemical process may be the co-precipitation method.

The alkaline-earth metal element-containing compound and the activator element-containing compound each may include at least one compound selected from a carbonate salt, a hydrogen carbonate salt, a phosphate salt, an oxalate salt, a sulfate, an organometallic compound, and a hydroxide.

The alkaline-earth metal element-containing compound and the activator element-containing compound each may include at least one compound selected from a carbonate salt and a hydroxide.

A volume average particle diameter of the silicon nitride particle may be less than or equal to about 150 nm.

The silicon nitride particle may be amorphous.

The firing of the phosphor precursor particle may include firing the phosphor precursor particle under a mixed gas atmosphere including at least hydrogen and nitrogen, or a mixed gas atmosphere including at least ammonia and nitrogen, at a temperature of about 1150° C. to about 1650° C.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
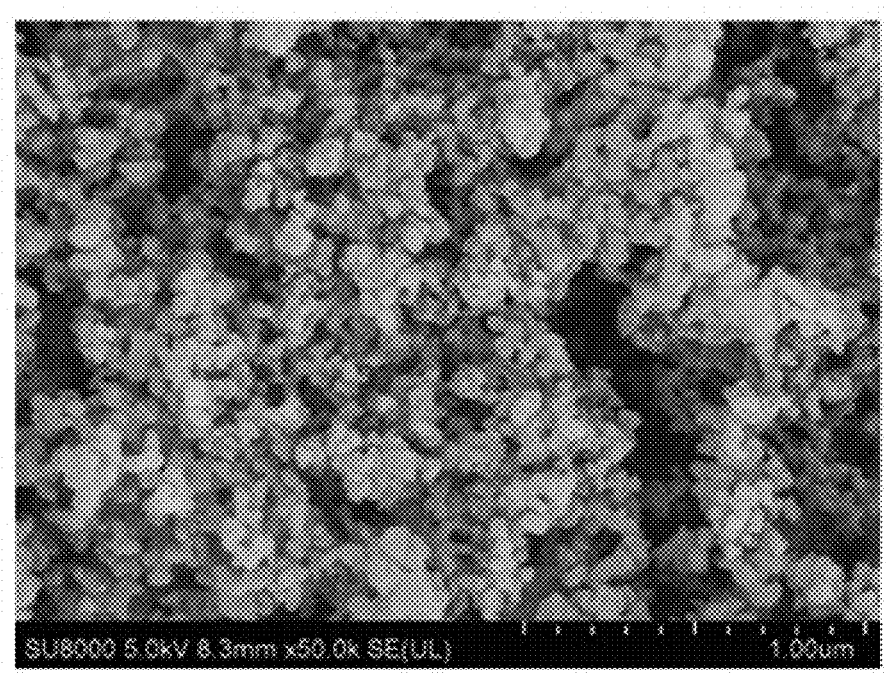
FIG. 1 is an image of a phosphor precursor particle obtained by a scanning electron microscope (SEM).

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

A. Phosphor

An example of a phosphor includes a nitride including an alkaline-earth metal element, silicon, and an element functioning as an activator (hereinafter, referred to as an activator element). The activator element is an element that functions as a light emitting center (color center) in the phosphor. The phosphor may include impurities in addition to the nitride as long as they do not have an unfavorable effect on photoluminescence characteristics of the phosphor.

The alkaline-earth metal element of the nitride may include calcium (Ca), strontium (Sr), barium (Ba), and magnesium (Mg).

The nitride may include the activator element to improve photoluminescence characteristics of the phosphor. Examples of the activator element may be europium (Eu), cerium (Ce), manganese (Mn), praseodymium (Pr), neodymium (Nd), samarium (Sm), terbium (Tb), dysprosium (Dy), holmium (Ho), erbium (Er), thulium (Tm), and ytterbium (Yb).

Examples of the nitride of the phosphor may be a nitride represented by the formula $M_2Si_5N_8$, in which M denotes an alkaline-earth metal element, or an alkaline-earth metal element and an activator element.

B. Method of Manufacturing Phosphor

An example of a phosphor may be prepared by a precursor preparation process to prepare a phosphor precursor particle and a firing process to fire the phosphor precursor particle. Hereinafter, each process is described in detail.

1. Precursor Preparation Process

As for raw materials, a silicon nitride particle and a material including an alkaline-earth metal element (hereinafter, an alkaline-earth metal element-containing material) are used. To improve photoluminescence characteristics of the phosphor, a material including an activator element (hereinafter, an activator element-containing material) is used.

The silicon nitride particle may be amorphous. When an amorphous silicon nitride particle is used as a raw material, cation exchanges of a silicon ion, an alkaline-earth metal ion, and an activator element ion may easily occur between a compound including an alkaline-earth metal element deposited on a surface of the silicon nitride particle (hereinafter, an alkaline-earth metal element-containing compound) and a compound including an activator element (hereinafter, an activator element-containing compound) during a firing process.

The silicon nitride particle may have, for example, a volume average particle diameter of less than or equal to about 150 nm, for example, less than or equal to about 120 nm. When the silicon nitride particle has a volume average particle diameter of less than or equal to about 150 nm, a phosphor precursor particle having a small particle diameter may be obtained, and thus a phosphor having a small particle diameter may be obtained. When the silicon nitride particle has a volume average particle diameter of less than or equal to about 150 nm, a phosphor having a relatively uniform particle distribution may be provided.

As an alkaline-earth metal element-containing material, examples of a Ca-containing material may be calcium oxide, calcium hydroxide, calcium carbonate, calcium nitrate 4 hydrate, calcium sulfate 2 hydrate, calcium oxalate 1 hydrate, calcium acetate 1 hydrate, calcium chloride, calcium fluoride, calcium nitride, calcium imine, and calcium amide. Particularly, for example, the Ca-containing material may be calcium nitrate 4 hydrate, or calcium chloride.

Examples of a Sr-containing material may be strontium oxide, strontium hydroxide 8 hydrate, strontium carbonate, strontium nitrate, strontium sulfate, strontium oxalate 1 hydrate, strontium acetate 0.5 hydrate, strontium chloride, strontium fluoride, strontium nitride, strontium imine, and strontium amide. Particularly, for example, the Sr-containing material may be strontium nitrate, or strontium chloride.

Examples of a Ba-containing material may be barium oxide, barium hydroxide 8 hydrate, barium carbonate, barium nitrate, barium sulfate, barium oxalate, barium acetate, barium chloride, barium fluoride, barium nitride, barium imine, and barium amide. Particularly, for example, the Ba-containing material may be barium nitrate, or barium chloride.

Examples of an Mg-containing material may be magnesium oxide, magnesium hydroxide, basic magnesium carbonate, magnesium nitrate 6 hydrate, magnesium sulfate, magnesium oxalate 2 hydrate, magnesium acetate 4 hydrate, magnesium chloride, magnesium fluoride, magnesium nitride, magnesium imine, and magnesium amide. Particularly, for example, the Mg-containing material may be magnesium nitrate and magnesium chloride.

As for the activator element-containing material, examples of a Eu-containing material may be europium oxide, europium sulfate, europium oxalate 10 hydrate, europium (II) chloride, europium (III) chloride, europium (II) fluoride, europium (III) fluoride, europium nitrate 6 hydrate, europium nitride, europium imine, and europium amide. Particularly, for example, the Eu-containing material may be europium nitrate 6 hydrate, europium oxide, and europium (II) chloride. In addition, examples of a material including an activator element Ce, Mn, Pr, Nd, Sm, Tb, Dy, Ho, Er, Tm, and Yb may be the Eu-containing compound including Ce, Mn, Pr, Nd, Sm, Tb, Dy, Ho, Er, Tm, or Yb instead of Eu.

In the preparing of the precursor, prepared are a silicon nitride particle, an alkaline-earth metal element-containing compound deposited on the surface of the silicon nitride particle, and an activator element-containing compound deposited on the surface of the silicon nitride particle, wherein a volume average particle diameter of the phosphor precursor particle is less than or equal to about 250 nm, for example, less than or equal to about 200 nm.

For example, to obtain a nitride represented by the formula $M_2Si_5N_8$, where M includes one or more alkaline-earth metal element selected from Ca, Sr, Ba, and Mg and including at least Sr and one or more activator element selected from Eu and Ce and including at least Eu, and Sr is included in an amount of, for example, about 15 mol % to about 99 mol %, for example, about 20 mol % to about 97.5 mol %, and the activator element is included in an amount of, for example, about 1 mol % to 20 mol %, for example, 2.5 mol % to 15 mol %, based on the total moles of M, in the precursor preparation process, a phosphor precursor particle is prepared including the silicon nitride particle, and a compound including one or more alkaline-earth metal element selected from Ca, Sr, Ba, and Mg and including at least Sr and a compound including one or more activator element selected from Eu and Ce and including at least Eu that are deposited on the surface of the silicon nitride particle, and having a volume average particle diameter of, for example, less than or equal to about 250 nm, for example, less than or equal to about 200 nm.

In the prepared phosphor precursor particle, a mole ratio of a total mole amount of the alkaline-earth metal element and the activator element to a mole amount of the silicon in the silicon nitride particle may be, for example, about 1:1 to about 1:1.6, or about 1:1.1 to about 1.1.5.

In case of the phosphor precursor particle, Sr is included in an amount of, for example, about 15 mol % to about 99 mol %, for example. about 20 mol % to about 97.5 mol %. and the activator element is included in an amount of, for example. about 1 mol % to about 20 mol %, for example. about 2.5 mol % to about 15 mol %. based on the total mole amount of the alkaline-earth metal element and the activator element.

The precursor preparation process includes a suspension liquid forming process and a precursor forming process.

[Suspension Liquid Forming Process]

To obtain a nitride having a target composition and including the alkaline-earth metal element and the silicon, a suspension liquid including a silicon nitride particle, an alkaline-earth metal element-containing material, and an activator element-containing material in a predetermined ratio as raw materials is prepared.

For example, when the $M_2Si_5N_8$-based nitride is obtained, a suspension liquid includes a silicon nitride particle, an alkaline-earth metal element-containing material, and an activator element-containing material as raw materials in a mole ratio of a total mole amount of the alkaline-earth metal element and the activator element and a mole amount of the silicon in the silicon nitride particle of, for example, about 1:1 to about 1:1.6, for example, about 1:1.1 to about 1:1.5. When the ratio ranges are not satisfied, a yield of the phosphor may be reduced and a production cost may be increased.

The suspension liquid may include, for example, Sr in an amount of about 15 mol % to about 99 mol %, for example, about 20 mol % to about 97.5 mol %, and the activator element in an amount of about 1 mol % to about 20 mol %, for example, about 2.5 mol % to about 15 mol %, based on the total moles of M.

The suspension liquid may be prepared by putting the raw materials in a solvent and then stirring the same. As the solvent for the suspension liquid, for example, water may be used. Examples of the solvent may be a mixed solvent of at least one polyhydric alcohol selected from ethylene glycol, propylene glycol, tetramethylene glycol, heptamethylene glycol, hexamethylene glycol, glycerine, and sorbitol, and water.

[Precursor Forming Process]

A wet chemical process is applied to the prepared suspension liquid to form a phosphor precursor particle including an alkaline-earth metal element-containing compound and an activator element-containing compound that are mixed and deposited on the surface of the silicon nitride particle, and having a volume average particle diameter of, for example, less than or equal to about 250 nm, for example, less than or equal to about 200 nm.

For example, when the $M_2Si_5N_8$-based nitride is obtained, a wet chemical process is applied to the prepared suspension liquid to precipitate an alkaline-earth metal element-containing compound and an activator element-containing compound and to form a phosphor precursor particle including an alkaline-earth metal element-containing compound and an activator element-containing compound that are mixed and deposited on the surface of the silicon nitride particle, and having a volume average particle diameter of, for example, less than or equal to about 250 nm, for example, less than or equal to about 200 nm.

In the phosphor precursor particle, a mole ratio of a total mole amount of the alkaline-earth metal element and the activator element to a mole amount of the silicon in the silicon nitride particle may be, for example, about 1:1 to about 1:1.6 or about 1:1.1 to about 1:1.5. When the ratio ranges are not satisfied, a yield of the phosphor may be reduced and a production cost may be increased.

In case of the phosphor precursor particle, Sr is included in an amount of, for example, about 15 mol % to about 99 mol %, for example, about 20 mol % to about 97.5 mol %, and the activator element is included in an amount of, for example, about 1 mol % to about 20 mol %, for example, about 2.5 mol % to about 15 mol %, based on the total mole amount of the alkaline-earth metal element and the activator element.

When the volume average particle diameter of the phosphor precursor particle is less than or equal to about 250 nm, a phosphor having a small particle diameter may be obtained. In addition, when the volume average particle diameter of the phosphor precursor particle is less than or equal to about 250 nm, a phosphor having relatively uniformly controlled particle distribution may be obtained.

When the wet chemical process is applied to the suspension liquid, the alkaline-earth metal element-containing compound and the activator element-containing compound are deposited on the surface of the silicon nitride particle in a form of a mixture. Accordingly, during a firing process, cation exchanges of a silicon ion, an alkaline-earth metal ion, and an activator element ion may easily occur. As a result, a synthesis reaction of a nitride having a target composition may be performed by a little particle growth.

The wet chemical process may be any method where the alkaline-earth metal element-containing compound and the activator element-containing compound are capable of being deposited on the surface of the silicon nitride particle in a form of a mixture. Non-limiting examples of the wet chemical process are a co-precipitation method and a citrate method. For the wet chemical process, only a co-precipitation method or only a citrate method may be used, or both a co-precipitation method and a citrate method may be used.

When the co-precipitation method or the citrate method is used as the wet chemical process, the alkaline-earth metal element-containing compound and the activator element-containing compound are easily precipitated, and thereby are easily deposited on the surface of the silicon nitride particle. Accordingly, during a firing process, cation exchanges of a silicon ion, an alkaline-earth metal ion, and an activator element ion may easily occur. As a result, a synthesis reaction of a nitride having a target composition may be performed by a little particle growth.

The co-precipitation method may be performed by adding a co-precipitator to the suspension liquid. Examples of the co-precipitator added to the suspension liquid may be an ammonium hydrogen carbonate aqueous solution, an ammonium carbonate aqueous solution, an urea aqueous solution, an acetamide aqueous solution, a thio urea aqueous solution, and a thio acetamide aqueous solution. Particularly, for example, an ammonium hydrogen carbonate aqueous solution or an ammonium carbonate aqueous solution may be used.

The citrate method may be performed by adding a citric acid to the suspension liquid.

The alkaline-earth metal element-containing compound and the activator element-containing compound deposited on the surface of the silicon nitride particle may be one or more compound selected from a carbonate salt, a hydrogen carbonate salt, a phosphate salt, an oxalate salt, a sulfate, an organometallic compound, and a hydroxide. Particularly, for example, one or more compound selected from a carbonate salt and a hydroxide may be used. The carbonate salt and the hydroxide may be easily precipitated using the co-precipitation method or the citrate method.

The phosphor precursor particle in the suspension liquid may be, for example, collected by centrifugation.

2. Firing Process

The obtained phosphor precursor particle is fired. The firing is performed under a controlled firing condition so that a phosphor having a target composition may have a desired particle diameter and excellent photoluminescence characteristics.

For example, to obtain the $M_2Si_5N_8$-based nitride, the obtained phosphor precursor particle is fired under a mixed gas atmosphere of hydrogen and nitrogen, or a mixed gas atmosphere of ammonia and nitrogen, at a temperature, for example, about 1150° C. to about 1650° C., for example, about 1200° C. to about 1600° C. By firing the phosphor precursor particle under these temperature and atmosphere conditions, a phosphor including an $M_2Si_5N_8$-based nitride as a main component and having improved photoluminescence characteristics is obtained. When the phosphor precursor particle is fired at greater than or equal to about 1150° C., a phosphor having excellent photoluminescence characteristics may be obtained by preventing $M_2Si_5N_8$-based nitride from lack of firing and generation of impurity other than the $M_2Si_5N_8$-based nitride. On the other hand, when the phosphor precursor particle is fired at less than or equal to about 1650° C., a phosphor having the $M_2Si_5N_8$-based nitride having a small particle diameter may be easily obtained by preventing overgrowth of the particle and also melt of the $M_2Si_5N_8$-based nitride.

The firing may be performed according to the following processes. First of all, the phosphor precursor particle is charged in a heat-resistant container made of a material having a low reactivity. The heat-resistant container may be a crucible tray, and the heat resistant material may be, for example, a ceramic such as alumina, boron nitride, silicon nitride, silicon carbide, magnesium, or mullite, a metal such as platinum, molybdenum, tungsten, tantalum, niobium, iridium, or rhodium, an alloy including at least one of the metals as a main component, or carbon (graphite). Non-limiting examples of the non-resistant container may be made of boron nitride, alumina, silicon nitride, silicon carbide, platinum, molybdenum, tungsten, or tantalum.

Then, the heat resistant container charged with the phosphor precursor particle is put in a firing device.

The firing device may be, for example, a metal furnace or a carbon furnace.

Subsequently, the internal pressure of the firing device in which the heat-resistant container is put is reduced to a vacuum. Next, the temperature of the firing device is increased to a heating temperature. Then, a predetermined gas is introduced into the firing device to restore its internal pressure to about atmospheric pressure or so. For example, the $M_2Si_5N_8$-based nitride is obtained by introducing a mixed gas of hydrogen and nitrogen or a mixed gas of ammonia and nitrogen into the firing device. Then, the temperature of the firing device is increased to a predetermined firing temperature and maintained at the predetermined firing temperature for a predetermined time. For example, to obtain the $M_2Si_5N_8$-based nitride, the firing temperature is, for example, increased to about 1150° C. to 1650° C., for example, about 1200° C. to about 1600° C.

C. Phosphor

A phosphor obtained through the aforementioned method may have a volume average particle diameter of, for example, about 50 nm to about 400 nm, for example, about 100 nm to about 300 nm, and an internal quantum efficiency of, for example, greater than or equal to about 60%, for example, greater than or equal to about 70%, at an excitation wavelength of greater than or equal to 450 nm. In other words, the phosphor obtained through the method has a small particle diameter and excellent photoluminescence characteristics.

For example, to obtain the $M_2Si_5N_8$-based nitride, the phosphor obtained by the manufacturing method includes a nitride represented by the formula $M_2Si_5N_8$ and having the same crystal structure as the material having the formula $Sr_2Si_5N_8$, where M includes one or more alkaline-earth metal element selected from Ca, Sr, Ba, and Mg and including at least Sr, and one or more activator element selected from Eu and Ce and including at least Eu, and Sr is included in an amount of about 15 mol % to about 99 mol %, for example, about 20 mol % to about 97.5 mol %, and the activator element is included in an amount of about 1 mol % to about 20 mol %, for example, about 2.5 mol % to about 15 mol %, based on the total moles of M. The phosphor may have a volume average particle diameter in a range of about 50 nm to about 400 nm, for example, in a range of about 100 nm to about 300 nm, and an internal quantum efficiency of greater than or equal to about 60%, for example, greater than or equal to about 70%, at an excitation wavelength of 450 nm. In other words, the phosphor has a small particle diameter and excellent photoluminescence characteristics.

Since the phosphor includes, for example, Sr of greater than or equal to about 15 mol % based on a total mole amount of M and thus prevents deterioration of a melting point of a target composition, an $M_2Si_5N_8$-based nitride, the phosphor including the $M_2Si_5N_8$-based nitride may be easily prepared. In addition, the phosphor includes less than or equal to about 99 mol % of Sr based on a total mole amount of M, and thus prevents deterioration of the amount of an activator element, and as a result has photoluminescence characteristics.

The phosphor includes greater than or equal to about 1 mol % of the activator element based on a total mole amount of M, and thus secures a predetermined amount of the activator element, and as a result has excellent photoluminescence characteristics. In addition, the phosphor includes less than or equal to about 20 mol % of the activator element based on a total mole amount of M, and thus prevents a concentration extinction phenomenon, and as a result has photoluminescence characteristics.

In addition, the phosphor obtained through the aforementioned manufacturing method may have a volume average particle index in a range, for example, of about 1.20 to about 1.35, for example, in a range of about 1.21 to about 1.31. When a volume average diameter index is in a range of about 1.20 to about 1.35, the phosphor may have a desired particle diameter.

In addition, the phosphor obtained through the above manufacturing method may further include a silicon-containing compound having a different crystal structure from the $M_2Si_5N_8$-based nitride, a target composition. The nitride may be included, for example, in an amount of greater than or equal to about 50 wt %, for example, in an amount of greater than or equal to about 70 wt %, based on a total mass of the nitride and the silicon-containing compound. When the nitride satisfies the range, a phosphor having excellent photoluminescence characteristics may be obtained.

D. Use of Phosphor

The phosphor obtained through the above manufacturing method may be used for a light conversion device such as LED lighting, a display, or other light conversion device. In addition, the phosphor has a small particle diameter of about 400 nm and may replace a conventional pigment.

EXAMPLES

Hereinafter, various Examples and Comparative Examples are described. These Examples and Comparative Examples, however, are not in any sense to be interpreted as limiting the scope of the disclosure of this application.

Measurement and analysis according to the Examples and Comparative Examples may be performed as follows.

<Measurement of Particle Distribution>

A particle distribution in the Examples and Comparative Examples is measured using a zeta-potential and particle size analyzer ELS-Z1000ZS (Otsuka Electronics Co., Ltd.). A sample is dispersed in ethanol or water by an ultrasonic wave for 30 seconds to be used for a measurement. Based on the measured particle distribution, a particle diameter at which a cumulative distribution reaches 16% is defined as D16v, a particle diameter at which a cumulative distribution reaches 50% is defined as D50v, and a particle diameter at which a cumulative distribution reaches 84% is defined as D84v by accumulating the volume of particles from particles having a smaller diameter to particles having a larger diameter within each divided diameter range. Herein, D50v is defined as a volume average particle diameter, and D84v/D16v is defined as a volume average particle index (PSDv).

In addition, a particle diameter at which a cumulative distribution reaches 50% is defined as a number average particle diameter by accumulating the number of particles within each divided diameter range beginning from a small diameter based on the particle distribution.

<Measurement of Excitation Photoluminescence Spectrum>

In the Examples and Comparative Examples, an excitation photoluminescence spectrum is measured using a fluorescence spectrophotometer F-7000 (Hitachi High-Technologies Co., Ltd.).

<Measurement of Internal Quantum Efficiency>

In the Examples and Comparative Examples, an internal quantum efficiency is measured using an absolute quantum efficiency-measuring device (Hamamatsu Photonics K.K.). The measurement is performed at an excitation wavelength of 450 nm by putting 0.1 g of a sample in the device.

<Scanning Electron Microscopy Examination>

In the Examples and Comparative Examples, a particle is examined using a scanning electron microscope (SEM) SU8020 (Hitachi High-Technologies Co., Ltd.).

<Metal Element Analysis>

In the Examples and Comparative Examples, a metal element analysis is performed using ICP-MS (Agilent Technologies) and ICP-AES (Shimadzu Corp.). The metal element analysis is performed using a flux (sand:carbonate soda=1:1) to alkali-melt a sample and adding hydrochloric acid thereto to obtain the sample in a static melt state. An Europium (Eu) analysis is performed with the ICP-MS, and the other metal element analyses are performed with the ICP-AES.

<Powder X-Ray Diffraction>

In the Examples and Comparative Examples, a powder X-ray diffraction is performed using an X-ray diffraction device, Smart Lap (Rigaku Corp.). The powder X-ray diffraction may be performed using $CuK\alpha$ as a ray source. An X-ray diffraction spectrum obtained through the powder X-ray diffraction is analyzed to perform qualitative and quantitative analyses of an inorganic compound formed in a sample.

Table 1 below shows various conditions during a precursor preparation process and a firing process of the Examples and Comparative Examples. In addition, Table 2 below shows characteristics of the obtained precursors and products obtained by firing the precursors.

TABLE 1

| | Target Composition (inorganic compound A) | Precursor process | | | | Firing process | | |
|---|---|---|---|---|---|---|---|---|
| | | $Si_3N_4$ | | $Sr(NO_3)_2$ | $Ca(NO_3)_2 \cdot 4H_2O$ | $Eu(NO_3)_3 \cdot 6H_2O$ | Atmosphere | | Temperature °C. |
| | | D50v (nm) | g | g | g | g | Kinds | Composition (volume) | |
| Ex. 1 | $Eu_{0.2}Sr_{1.8}Si_5N_8$ | 50 | 3.354 | 11.93 | 0 | 3.199 | $H_2/N_2$ | 4%/96% | 1550 |
| Ex. 2 | $Eu_{0.2}Sr_{0.9}Ca_{0.9}Si_5N_8$ | 50 | 3.354 | 5.965 | 6.656 | 3.199 | $H_2/N_2$ | 4%/96% | 1550 |
| Ex. 3 | $Eu_{0.2}Sr_{1.8}Si_5N_8$ | 50 | 3.354 | 11.93 | 0 | 3.199 | $NH_3/N_2$ | 4%/96% | 1550 |
| Ex. 4 | $Eu_{0.2}Sr_{1.8}Si_5N_8$ | 50 | 3.354 | 11.93 | 0 | 3.199 | $H_2/N_2$ | 4%/96% | 1250 |
| Ex. 5 | $Eu_{0.2}Sr_{1.8}Si_5N_8$ | 50 | 3.354 | 11.93 | 0 | 3.199 | $H_2/N_2$ | 4%/96% | 1625 |
| Ex. 6 | $Eu_{0.2}Sr_{1.4}Ca_{0.4}Si_5N_8$ | 50 | 3.354 | 8.791 | 3.503 | 3.199 | $H_2/N_2$ | 4%/96% | 1550 |
| Ex. 7 | $Eu_{0.2}Sr_{1.4}Ca_{0.4}Si_5N_8$ | 50 | 3.354 | 2.512 | 10.510 | 3.199 | $H_2/N_2$ | 4%/96% | 1550 |
| Ex. 8 | $Eu_{0.3}Sr_{1.7}Si_5N_8$ | 50 | 3.354 | 8.359 | 0 | 9.597 | $H_2/N_2$ | 4%/96% | 1550 |
| Ex. 9 | $Eu_{0.05}Sr_{1.95}Si_5N_8$ | 50 | 3.354 | 12.92 | 0 | 1.418 | $H_2/N_2$ | 4%/96% | 1550 |
| Ex. 10 | $Eu_{0.2}Sr_{1.8}Si_5N_8$ | 110 | 3.354 | 11.93 | 0 | 3.199 | $H_2/N_2$ | 4%/96% | 1550 |
| Ex. 11 | $Eu_{0.2}Sr_{1.8}Si_5N_8$ | 25 | 3.354 | 11.93 | 0 | 3.199 | $H_2/N_2$ | 4%/96% | 1550 |
| Ex. 12 | $Eu_{0.2}Sr_{1.8}Si_5N_8$ | 50 | 3.354 | 14.10 | 0 | 3.781 | $H_2/N_2$ | 4%/96% | 1550 |
| Ex. 13 | $Eu_{0.2}Sr_{1.8}Si_5N_8$ | 50 | 3.354 | 10.34 | 0 | 2.772 | $H_2/N_2$ | 4%/96% | 1550 |
| Comp. Ex. 1 | $Eu_{0.2}Sr_{1.8}Si_5N_8$ | 195 | 3.354 | 11.93 | 0 | 3.199 | $H_2/N_2$ | 4%/96% | 1550 |

TABLE 1-continued

| | Target Composition (inorganic compound A) | Precursor process | | | | | Firing process | | |
|---|---|---|---|---|---|---|---|---|---|
| | | Si$_3$N$_4$ D50v (nm) | Si$_3$N$_4$ g | Sr(NO$_3$)$_2$ g | Ca(NO$_3$)$_2$·4H$_2$O g | Eu(NO$_3$)$_3$·6H$_2$O g | Atmosphere Kinds | Composition (volume) | Temperature °C. |
| Comp. Ex. 2 | Eu$_{0.2}$Sr$_{1.8}$Si$_5$N$_8$ | 50 | 3.354 | 11.93 | 0 | 3.199 | N$_2$ | 100% | 1550 |
| Comp. Ex. 3 | Eu$_{0.2}$Sr$_{1.8}$Sr$_5$N$_8$ | 50 | 3.354 | 11.93 | 0 | 3.199 | H$_2$/N$_2$ | 4%/96% | 1100 |
| Comp. Ex. 4 | Eu$_{0.2}$Sr$_{1.8}$Si$_5$N$_8$ | 50 | 3.354 | 11.93 | 0 | 3.199 | H$_2$/N$_2$ | 4%/96% | 1700 |
| Comp. Ex. 5 | Eu$_{0.2}$Sr$_{0.9}$Ca$_{0.9}$Si$_5$N$_8$ | 50 | 3.354 | 5.965 | 6.656 | 3.199 | H$_2$/N$_2$ | 4%/96% | 1700 |
| Comp. Ex. 6 | Eu$_{0.2}$Sr$_{0.2}$Ca$_{1.6}$Si$_5$N$_8$ | 50 | 3.354 | 1.256 | 11.91 | 3.199 | H$_2$/N$_2$ | 4%/96% | 1550 |
| Comp. Ex. 7 | Eu$_{0.01}$Sr$_{1.99}$Si$_5$N$_8$ | 50 | 3.354 | 13.53 | 0 | 0.3199 | H$_2$/N$_2$ | 4%/96% | 1550 |
| Comp. Ex. 8 | Eu$_{0.5}$Sr$_{1.5}$Si$_5$N$_8$ | 50 | 3.354 | 4.781 | 0 | 15.995 | H$_2$/N$_2$ | 4%/96% | 1550 |
| Comp. Ex. 9 | The phosphor according to Comp. Ex. 4 pulverized by a bead mill | | | | | | | | |
| Comp. Ex. 10 | Eu$_{0.2}$Sr$_{1.8}$Si$_5$N$_8$ | 50 | 3.354 | 16.33 | 0 | 4.378 | H$_2$/N$_2$ | 4%/96% | 1550 |
| Comp. Ex. 11 | Eu$_{0.2}$Sr$_{1.8}$Si$_5$N$_8$ | 50 | 3.354 | 9.40 | 0 | 2.520 | H$_2$/N$_2$ | 4%/96% | 1550 |

TABLE 2

| | Phosphor | | | | | | |
|---|---|---|---|---|---|---|---|
| | Powder X-ray diffraction | | Particle characteristics | | Fluorescence characteristics | | Internal quantum efficiency % |
| | Precursor D50v (nm) | Silicon-containing compound | Content (mass %) | D50v (nm) | PSDv | Excitation light (nm) | Photoluminescence peak (nm) | |
| Ex. 1 | 122 | Sr$_2$SiO$_4$ | 20 | 160 | 1.24 | 200-550 | 660 | 73 |
| Ex. 2 | 127 | Sr$_2$SiO$_4$ | 15 | 145 | 1.25 | 200-550 | 668 | 81 |
| Ex. 3 | 112 | Sr$_2$SiO$_4$ | 10 | 155 | 1.27 | 200-550 | 659 | 83 |
| Ex. 4 | 120 | Sr$_2$SiO$_4$ | 16 | 156 | 1.26 | 200-550 | 658 | 72 |
| Ex. 5 | 119 | Sr$_2$SiO$_4$ | 15 | 170 | 1.23 | 200-550 | 651 | 80 |
| Ex. 6 | 116 | Sr$_2$SiO$_4$ | 13 | 155 | 1.28 | 200-550 | 662 | 79 |
| Ex. 7 | 120 | Sr$_2$SiO$_4$ | 15 | 149 | 1.23 | 200-550 | 649 | 77 |
| Ex. 8 | 125 | Sr$_2$SiO$_4$ | 19 | 163 | 1.30 | 200-550 | 661 | 75 |
| Ex. 9 | 128 | Sr$_2$SiO$_4$ | 20 | 155 | 1.29 | 200-550 | 650 | 74 |
| Ex. 10 | 196 | Sr$_2$SiO$_4$ | 16 | 298 | 1.23 | 200-550 | 661 | 79 |
| Ex. 11 | 56 | Sr$_2$SiO$_4$ | 13 | 108 | 1.25 | 200-550 | 659 | 73 |
| Ex. 12 | 125 | Sr$_2$SiO$_4$ | 18 | 162 | 1.25 | 200-550 | 660 | 72 |
| Ex. 13 | 115 | Sr$_2$SiO$_4$ | 22 | 143 | 1.22 | 200-550 | 660 | 74 |
| Comp. Ex. 1 | 305 | Sr$_2$SiO$_4$ | 20 | 465 | 1.43 | 200-550 | 661 | 76 |
| Comp. Ex. 2 | 120 | Sr$_2$SiO$_4$ | 86 | 177 | 1.31 | 200-550 | 557 | 50 |
| Comp. Ex. 3 | 123 | Phosphor is not obtained because firing temperature is too low | | | | | | |
| Comp. Ex. 4 | 118 | Sr$_2$SiO$_4$ | 6 | 10320 | 1.45 | 200-550 | 661 | 81 |
| Comp. Ex. 5 | 113 | Phosphor is not obtained because phosphor precursor melts during firing | | | | | | |
| Comp. Ex. 6 | 116 | Phosphor is not obtained because phosphor precursor melts during firing | | | | | | |
| Comp. Ex. 7 | 122 | Sr$_2$SiO$_4$ | 18 | 180 | 1.31 | 200-550 | 660 | 45 |
| Comp. Ex. 8 | 131 | Sr$_2$SiO$_4$ | 15 | 175 | 1.30 | 200-550 | 661 | 39 |
| Comp. Ex. 9 | 131 | Sr$_2$SiO$_4$ | — | 285 | 1.32 | 200-550 | 658 | 36 |

TABLE 2-continued

| | Phosphor | | | | | | |
|---|---|---|---|---|---|---|---|
| | Powder X-ray diffraction | | | Particle characteristics | | Fluorescence characteristics | | Internal quantum efficiency % |
| | Precursor D50v (nm) | Silicon-containing compound | Content (mass %) | D50v (nm) | PSDv | Excitation light (nm) | Photoluminescence peak (nm) | |
| Comp. Ex. 10 | 135 | $Sr_2SiO_4$ | 60 | 205 | 1.43 | 200-550 | 555 | 53 |
| Comp. Ex. 11 | 105 | $SrSi_2O_2N_2$ | 58 | 695 | 1.58 | 200-550 | 550 | 58 |

Example 1

[Precursor Preparation Process]
(Suspension Liquid Forming Process)

An amorphous silicon nitride ($Si_3N_4$) particle having a volume average particle diameter (D50v) of 50 nm (Sigma-Aldrich Co., Ltd.), strontium nitrate ($Sr(NO_3)_2$) (Kishida Chemical Co., Ltd.), and europium nitrate 6 hydrate (Eu$(NO_3)_3 \cdot 6H_2O$) (Kishida Chemical Co., Ltd.) are used as raw materials.

3.354 g of a silicon nitride particle, 11.93 g of strontium nitrate, and 3.199 g of europium nitrate 6 hydrate are respectively weighed to obtain a nitride represented by the formula $Eu_{0.2}Sr_{1.8}Si_5N_8$.

Accordingly, the phosphor precursor particle and its suspension liquid described below have a mole ratio of 1:1.3 between a total mole amount of Sr and Eu and a mole amount of silicon and include 90 mol % of Sr and 10 mol % of Eu based on a total mole amount of Sr and Eu. The weighed raw materials are put in 150 g of water, and the mixture is stirred to obtain the suspension liquid.

(Precursor Forming Process)

Ammonium hydrogen carbonate (Kishida Chemical Co., Ltd.) is dissolved in 200 ml of water to form a co-precipitator.

Subsequently, the co-precipitator is added to the suspension liquid in a dropwise fashion over 2 hours while the suspension liquid is stirred and mixed.

After adding the co-precipitator in a dropwise fashion, the mixture is continued being stirred and mixed for 1 hour.

The stirring precipitates strontium ions into a carbonate salt and europium ions into a hydroxide to form a phosphor precursor particle in which the carbonate salt of strontium and the hydroxide of europium are uniformly mixed on the surface of a silicon nitride particle.

Then, the phosphor precursor particle is collected by putting a suspension liquid including the phosphor precursor particle in a 100° C. drier to evaporate water.

[Firing Process]

The obtained phosphor precursor particle is fired according to the following order. First, the phosphor precursor particle is charged in a crucible made of boron nitride. The crucible charged with the phosphor precursor particle is put under a vacuum atmosphere (a metal furnace, Nemus Tech. Co., Ltd.) by reducing the pressure inside the furnace to a vacuum using a diffusion pump, and the temperature of the furnace is increased from room temperature up to 1100° C. at a speed of 300° C./hr. The temperature of the furnace is maintained at 1100° C., and a mixed gas of 4 volume % of hydrogen and 96 volume % of nitrogen is introduced into the furnace to increase the pressure of the furnace to atmospheric pressure or so. The furnace is internally heated up to 1550° C. at a speed of 300° C./hr and maintained at 1550° C. for 5 hours to fire the phosphor precursor particle and thus obtain a fired product (phosphor) according to Example 1.

[Characteristics of Phosphor Precursor Particle]

The phosphor precursor particle of Example 1 is examined using a scanning electron microscope. FIG. 1 shows an image of the phosphor precursor particle obtained by a scanning electron microscope (SEM).

In FIG. 1, many particles having a particle diameter of about 100 nm are found. Herein, the carbonate salt of strontium and the hydroxide of europium turn out to be accumulated on the surface of the silicon nitride particle.

In addition, a particle distribution of the phosphor precursor particles according to Example 1 is measured. Referring to the particle distribution, the volume average particle diameter (D50v) of the phosphor precursor particles is 122 nm.

[Characteristics of Phosphor]

Figure 2:
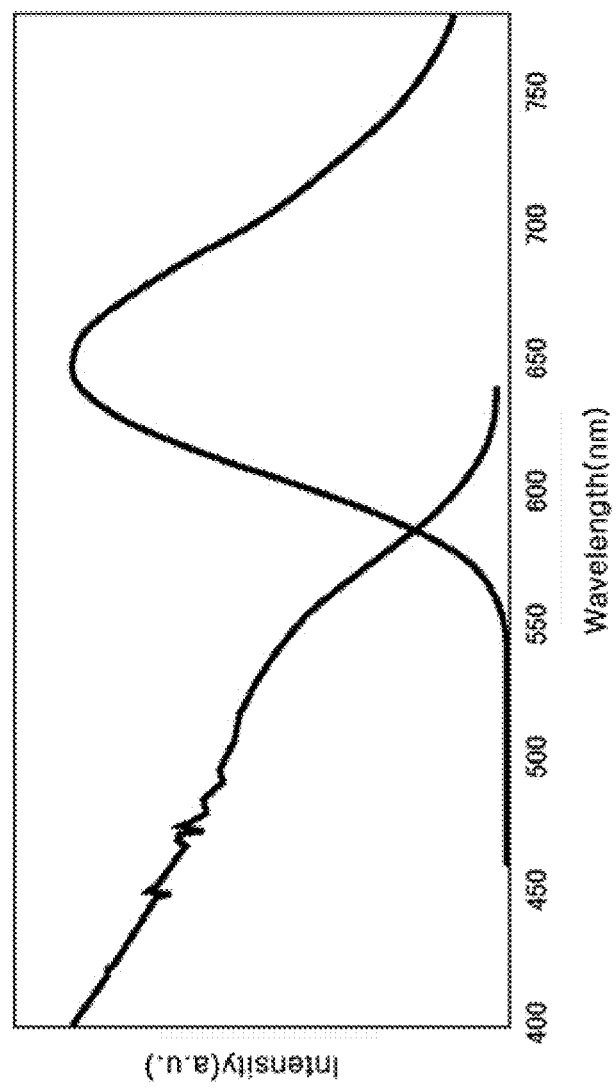
FIG. 2 shows an excitation photoluminescence spectrum of a phosphor according to an Example 1 described in this application.

The excitation photoluminescence spectrum of the fired product according to Example 1 is measured. FIG. 2 shows the excitation photoluminescence spectrum of the phosphor according to Example 1.

In FIG. 2, a horizontal axis indicates a wavelength, while a vertical axis indicates intensity. Referring to the excitation photoluminescence spectrum, the fired product may be excited by light having a wide wavelength range from ultraviolet light of greater than or equal to 200 nm to visible light of less than or equal to 550 nm and have a photoluminescence peak wavelength of 660 nm. Accordingly, the fired product is a phosphor excited by visible light and emitting red light.

Figure 3:
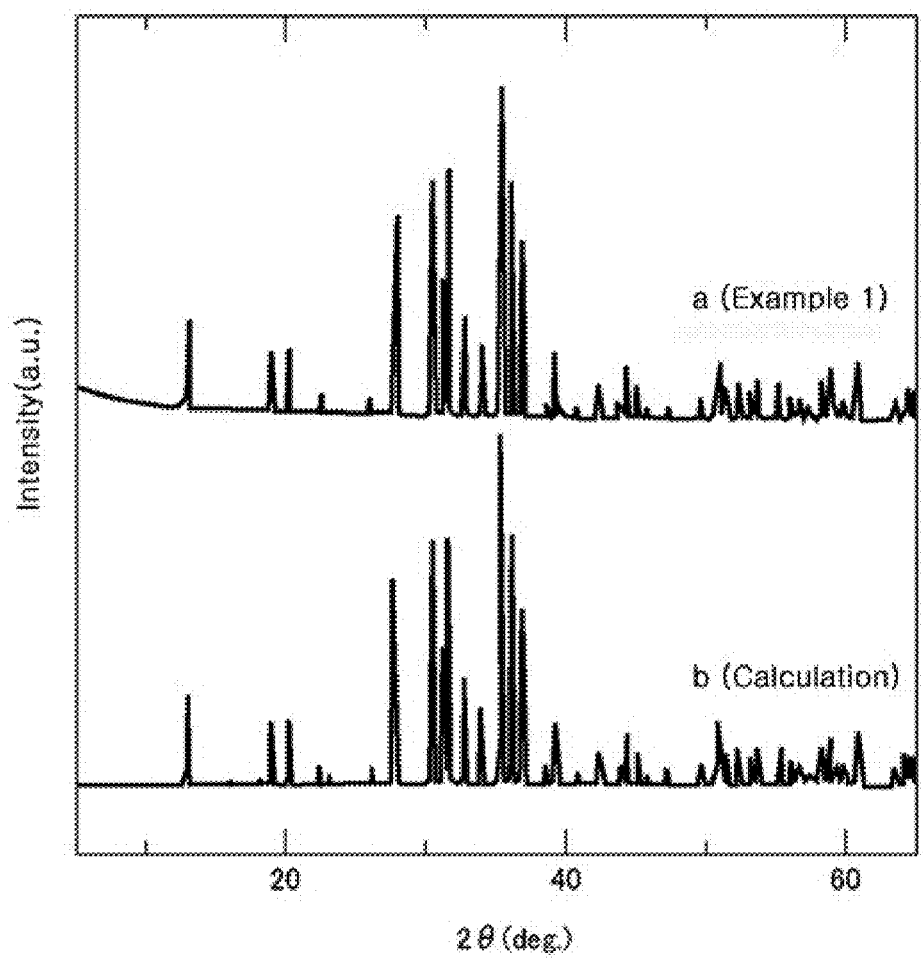
FIG. 3 shows an X-ray diffraction spectrum of the phosphor according to Example 1.

In addition, a powder X-ray diffraction of the phosphor according to Example 1 is performed. FIG. 3 shows an X-ray diffraction spectrum of the phosphor according to Example 1. In FIG. 3, "a" denotes an X-ray diffraction spectrum of the phosphor according to Example 1. In FIG. 3, a horizontal axis indicates an angle between an incident X ray direction and a diffraction X ray direction, and a vertical axis indicates intensity.

As a result of interpreting the X-ray diffraction spectrum using a Rietveld refinement method, a nitride having the same crystal structure as a material represented by the formula $Sr_2Si_5N_8$ and a silicon-containing compound having the same crystal structure as a material represented by the formula $Sr_2SiO_4$ are formed in the fired product. In addition, the nitride is generated in an amount of 80 mass % and the silicon-containing compound is generated in an amount of 20 mass % based on a total mass of the nitride and the silicon-containing compound. On the other hand, "b" in FIG. 3 shows an X-ray diffraction spectrum of the $Sr_2Si_5N_8$ crystal obtained by calculation.

In addition, a metal element analysis of the phosphor according to Example 1 is performed, and reveals that the phosphor includes Sr and Eu in a mole ratio of Sr:Eu=0.9:0.1.

Furthermore, a particle distribution of the phosphor according to Example 1 is measured, and reveals that the phosphor has a volume average particle diameter (D50v) of 160 nm and a volume average particle distribution index (PSDv) of 1.24.

In addition, an internal quantum efficiency of the phosphor according to Example 1 at an excitation wavelength of 450 nm is measured, and reveals that the phosphor has an internal quantum efficiency of 73% at an excitation wavelength of 450 nm.

As described above, the phosphor of Example 1 includes a nitride containing Sr, Eu, and Si. The phosphor is represented by the formula $Eu_{0.2}Sr_{1.8}Si_5N_8$. The phosphor includes 90 mol % of Sr and 10 mol % of Eu based on a total mole amount of Sr and Eu. On the other hand, the nitride has the same crystal structure as a material represented by the formula $Sr_2Si_5N_8$. The phosphor has a volume average particle diameter (D50v) of 160 nm and a volume average particle distribution index (PSDv) of 1.24. The phosphor has an internal quantum efficiency of 73% at an excitation wavelength of 450 nm. The phosphor includes 80 mass % of the nitride based on a total mass of the nitride and the silicon-containing compound.

Example 2

An amorphous silicon nitride particle having a volume average particle diameter (D50v) of 50 nm (Sigma-Aldrich Co., Ltd.), strontium nitrate (Kishida Chemical Co., Ltd.), calcium nitrate 4 hydrate ($Ca(NO_3)_2 \cdot 4H_2O$) (Kishida Chemical Co., Ltd.), and europium nitrate 6 hydrate (Kishida Chemical Co., Ltd.) as raw materials are used.

3.354 g of the silicon nitride particle, 5.965 g of the strontium nitrate, 6.656 g of the calcium nitrate 4 hydrate, and 3.199 g of the europium nitrate 6 hydrate are respectively weighed to obtain nitride represented by the formula $Eu_{0.2}Sr_{0.9}Ca_{0.9}Si_5N_8$.

Accordingly, a suspension liquid described below and the phosphor precursor particle have a mole ratio of 1:1.3 between a total mole amount of Sr and Eu and a mole amount of silicon, and the phosphor precursor particle includes 45 mol % of Sr and 10 mol % of Eu based on a total mole amount of Sr, Ca, and Eu.

Except for the above, a phosphor precursor particle and a fired product (phosphor) according to Example 2 is obtained according to the same method as Example 1.

As a result of measuring a particle distribution of the phosphor precursor particle according to Example 2, the phosphor precursor particle has a volume average particle diameter (D50v) of 127 nm.

In addition, as a result of measuring an excitation photoluminescence spectrum, the fired product of Example 2 may be excited by light of a wavelength ranging from 200 nm to 550 nm and has a photoluminescence peak wavelength of 668 nm. Referring to the result, the fired product is a phosphor excited by visible light and emitting red light.

In addition, as a result of performing a powder X-ray diffraction of the fired product according to Example 2, a nitride having the same crystal structure as a material represented by the formula $Sr_2Si_5N_8$ and a silicon-containing compound having the same crystal structure as a material represented by the formula $Sr_2SiO_4$ are generated. Furthermore, the nitride is generated in an amount of 85 mass % and the silicon-containing compound is generated in an amount of 15 mass % based on a total mass of the nitride and the silicon-containing compound.

In addition, as a result of performing a metal element analysis of the fired product according to Example 2, Sr, Ca, and Eu are respectively included in a mole ratio of Sr:Ca:Eu=0.45:0.45:0.1.

Furthermore, when a particle distribution of the fired product according to Example 2 is measured, the fired product has a volume average particle diameter (D50v) of 145 nm and a volume average particle distribution index (PSDv) of 1.25.

In addition, when an internal quantum efficiency of the fired product according to Example 2 at an excitation wavelength of 450 nm is measured, the fired product has an internal quantum efficiency of 81% at an excitation wavelength of 450 nm.

As described above, the phosphor according to Example 2 includes a nitride containing Sr, Ca, Eu, and Si. The phosphor is represented by the formula $Eu_{0.2}Sr_{0.9}Ca_{0.9}Si_5N_8$. The phosphor includes 45 mol % of Sr and 10 mol % of Eu based on a total mole amount of Sr, Ca, and Eu. On the other hand, the nitride has the same crystal structure as a material represented by the formula $Sr_2Si_5N_8$. The phosphor has a volume average particle diameter (D50v) of 145 nm and a volume average particle distribution index (PSDv) of 1.25. The phosphor has an internal quantum efficiency of 81% at an excitation wavelength of 450 nm. The phosphor includes the nitride of 85 mass % based on a total mass of the nitride and the silicon-containing compound.

Example 3

A phosphor precursor particle is obtained according to the same method as Example 1. A fired product (phosphor) according to Example 3 is obtained according to the same method as Example 1 except for firing the phosphor precursor particle under a mixed gas atmosphere of ammonia of 4 volume % and nitrogen of 96 volume %.

As a result of performing the same measurement and analysis of Example 1, the volume average particle diameter (D50v) of the phosphor precursor particle of Example 3 is 112 nm. In addition, the fired product of Example 3 may be excited by light of a wavelength ranging from 200 nm to 550 nm and has a photoluminescence peak wavelength of 659 nm. Accordingly, the fired product of Example 3 is a phosphor excited by visible light and emitting red light. In addition, in the fired product of Example 3, a nitride having the same crystal structure as a material represented by the formula $Sr_2Si_5N_8$ and a silicon-containing compound having the same crystal structure as a material represented by the formula $Sr_2SiO_4$ are generated. Furthermore, the nitride is generated in an amount of 90 mass % and the silicon-containing compound is generated in an amount of 10 mass % based on a total mass of the nitride and the silicon-containing compound. In addition, the fired product of Example 3 includes Sr and Eu in a mole ratio of Sr:Eu=0.9:0.1. Furthermore, the fired product of Example 3 has volume average particle diameter (D50v) of 155 nm and a volume average particle distribution index (PSDv) of 1.27. In addition, the fired product of Example 3 has an internal quantum efficiency of 83% at an excitation wavelength of 450 nm.

As described above, the phosphor of Example 3 includes a nitride containing Sr, Eu, and Si. The phosphor is represented by the formula $Eu_{0.2}Sr_{1.8}Si_5N_8$. The phosphor includes Sr of 90 mol % and Eu of 10 mol % based on a total mole amount of Sr and Eu. On the other hand, the nitride has the same crystal structure as a material represented by the formula $Sr_2Si_5N_8$. The phosphor has a volume average particle diameter (D50v) of 155 nm and a volume average particle distribution index (PSDv) of 1.27. The phosphor has an internal quantum efficiency of 83% at an excitation wavelength of 450 nm. The phosphor includes the nitride of 90 mass % based on a total mass of the nitride and the silicon-containing compound.

Example 4

A phosphor precursor particle is obtained according to the same method as Example 1. A fired product (phosphor) of Example 4 is obtained according to the same method as Example 1 except for firing the phosphor precursor particle at 1250° C.

As a result of performing the same measurement and analysis as Example 1, the volume average particle diameter (D50v) of the phosphor precursor particle of Example 4 is 120 nm. In addition, the fired product of Example 4 may be excited by light of a wavelength ranging from 200 nm to 550 nm and has a photoluminescence peak wavelength of 658 nm. Accordingly, the fired product of Example 4 is a phosphor excited by visible light and emitting red light. In addition, in the fired product of Example 4, a nitride having the same crystal structure as a material represented by the formula $Sr_2Si_5N_8$ and a silicon-containing compound having the same crystal structure as a material represented by the formula $Sr_2SiO_4$ are generated. Furthermore, the nitride is generated in an amount of 84 mass % and the silicon-containing compound is generated in an amount of 16 mass % based on a total mass of the nitride and the silicon-containing compound. In addition, the fired product of Example 4 includes Sr and Eu in a mole ratio of Sr:Eu=0.9:0.1. Furthermore, the fired product of Example 4 has a volume average particle diameter (D50v) of 156 nm and a volume average particle distribution index (PSDv) of 1.26. In addition, the fired product of Example 4 has an internal quantum efficiency of 72% at an excitation wavelength of 450 nm.

As described above, the phosphor of Example 4 includes the nitride containing Sr, Eu, and Si. The phosphor is represented by the formula $Eu_{0.2}Sr_{1.8}Si_5N_8$. The phosphor includes Sr of 90 mol % and Eu of 10 mol % based on a total mole amount of Sr and Eu. On the other hand, the nitride has the same crystal structure as a material represented by the formula $Sr_2Si_5N_8$. The phosphor has a volume average particle diameter (D50v) of 156 nm and a volume average particle distribution index (PSDv) of 1.26. The phosphor has an internal quantum efficiency of 72% at an excitation wavelength of 450 nm. The phosphor includes the nitride of 84 mass % based on a total mass of the nitride and the silicon-containing compound.

Example 5

A phosphor precursor particle is obtained according to the same method as Example 1. The fired product (phosphor) of Example 5 is obtained according to the same method as Example 1 except for firing the phosphor precursor particle at 1625° C.

As a result of performing the same measurement and analysis as Example 1, the volume average particle diameter (D50v) of the phosphor precursor particle of Example 5 is 119 nm. In addition, the fired product of Example 5 is excited at a wavelength ranging from 200 nm to 550 nm and has a photoluminescence peak wavelength of 651 nm. Accordingly, the fired product of Example 5 is a phosphor excited by visible light and emitting red light. In the fired product of Example 5, a nitride having the same crystal structure as a material represented by the formula $Sr_2Si_5N_8$ and a silicon-containing compound having the same crystal structure as a material represented by the formula $Sr_2SiO_4$ are generated. In addition, the nitride is generated in an amount of 85 mass % and the silicon-containing compound is generated in an amount of 15 mass % based on a total mass of the nitride and the silicon-containing compound. In addition, the fired product of Example 5 includes Sr and Eu in a mole ratio of Sr:Eu=0.9:0.1. Furthermore, the fired product of Example 5 has a volume average particle diameter (D50v) of 170 nm and a volume average particle distribution index (PSDv) of 1.23. In addition, the fired product of Example 5 has an internal quantum efficiency of 80% at an excitation wavelength of 450 nm.

As described above, the phosphor according to Example 5 includes the nitride containing Sr, Eu, and Si. The phosphor is represented by the formula $Eu_{0.2}Sr_{1.8}Si_5N_8$. The phosphor includes 90 mol % of Sr and 10 mol % of Eu based on a total mole amount of Sr and Eu. On the other hand, the nitride has the same crystal structure as a material represented by the formula $Sr_2Si_5N_8$. The phosphor has a volume average particle diameter (D50v) of 170 nm and a volume average particle distribution index (PSDv) of 1.23. The phosphor has an internal quantum efficiency of 80% at an excitation wavelength of 450 nm. The phosphor includes the nitride of 85 mass % based on a total mass of the nitride and the silicon-containing compound.

Example 6

A phosphor precursor particle and a fired product (phosphor) according to Example 6 are obtained according to the same method as Example 2 except for respectively weighing 3.354 g of a silicon nitride particle, 8.791 g of strontium nitrate, 3.503 g of calcium nitrate 4 hydrate, and 3.199 g of europium nitrate 6 hydrate to obtain a nitride represented the formula $Eu_{0.2}Sr_{1.4}Ca_{0.4}Si_5N_8$.

As a result of performing the same measurement and analysis as Example 1, the volume average particle diameter (D50v) of the phosphor precursor particle according to Example 6 is 116 nm. In addition, the fired product according to Example 6 may be excited by light of a wavelength ranging from 200 nm to 550 nm and has a photoluminescence peak wavelength of 662 nm. Accordingly, the fired product according to Example 6 is a phosphor excited by visible light and emitting red light. In addition, in the fired product according to Example 6, a nitride having the same crystal structure as a material represented by the formula $Sr_2Si_5N_8$ and a silicon-containing compound having the same crystal structure as a material represented by the formula $Sr_2SiO_4$ are generated Furthermore, the nitride is generated in an amount of 87 mass % and the silicon-containing compound is generated in an amount of 13 mass % based on a total mass of the nitride and the silicon-containing compound. In addition, the fired product according to Example 6 includes Sr, Ca, and Eu in a mole ratio of Sr:Ca:Eu=0.7:0.2:0.1. In addition, the fired product according to Example 6 has a volume average particle diameter (D50v) of 155 nm and a volume average particle distribution index (PSDv) of 1.28. In addition, the fired product according to Example 6 has an internal quantum efficiency of 79% at an excitation wavelength of 450 nm.

As described above, the phosphor according to Example 6 includes the nitride containing Sr, Ca, Eu, and Si. The phosphor is represented by the formula $Eu_{0.2}Sr_{1.4}Ca_{0.4}Si_5N_8$. The phosphor includes 70 mol % of Sr and 10 mol % of Eu based on a total mole amount of Sr, Ca, and Eu. On the other hand, the nitride has the same crystal structure as a material represented by the formula $Sr_2Si_5N_8$. The phosphor has a volume average particle diameter (D50v) of 155 nm and a volume average particle distribution index (PSDv) of 1.28. The phosphor has an internal quantum efficiency of 79% at an excitation wavelength of 450 nm. The phosphor includes 87 mass % of the nitride based on a total mass of the nitride and the silicon-containing compound.

Example 7

A phosphor precursor particle and a fired product (phosphor) according to Example 7 are obtained according to the same method as Example 2 except for respectively weighing 3.354 g of a silicon nitride particle, 2.512 g of strontium nitrate, 10.510 g of calcium nitrate 4 hydrate, and 3.199 g of europium nitrate 6 hydrate to obtain a nitride represented by the formula $Eu_{0.2}Sr_{1.4}Ca_{0.4}Si_5N_8$.

As a result of performing the same measurement and analysis as Example 1, the volume average particle diameter (D50v) of the phosphor precursor particle according to Example 7 is 120 nm. In addition, the fired product according to Example 7 may be excited by light of a wavelength ranging from 200 nm to 550 nm and has a photoluminescence peak wavelength of 649 nm. Accordingly, the fired product according to Example 7 is a phosphor excited by visible light. In addition, in the fired product according to Example 7, a nitride having the same crystal structure as a material represented by the formula $Sr_2Si_5N_8$ and a silicon-containing compound having the same crystal structure as a material represented by the formula $Sr_2SiO_4$ are generated. Furthermore, the nitride is generated in an amount of 85 mass % and the silicon-containing compound is generated in an amount of 15 mass % based on a total mass of the nitride and the silicon-containing compound. In addition, the fired product according to Example 7 includes Sr, Ca, and Eu in a mole ratio of Sr:Ca:Eu=0.7:0.2:0.1. Furthermore, the fired product according to Example 7 has a volume average particle diameter (D50v) of 149 nm and a volume average particle distribution index (PSDv) of 1.23. In addition, the fired product according to Example 7 has an internal quantum efficiency of 77% at an excitation wavelength of 450 nm.

As described above, the phosphor according to Example 7 includes the nitride containing Sr, Ca, Eu, and Si. The phosphor is represented by the formula $Eu_{0.2}Sr_{1.4}Ca_{0.4}Si_5N_8$. The phosphor includes 20 mol % of Sr and 10 mol % of Eu based on a total mole amount of Sr, Ca, and Eu. On the other hand, the nitride has the same crystal structure as a material represented by the formula $Sr_2Si_5N_8$. The phosphor has a volume average particle diameter (D50v) of 149 nm and a volume average particle distribution index (PSDv) of 1.23. The phosphor has an internal quantum efficiency of 77% at an excitation wavelength of 450 nm. The phosphor includes 85 mass % of the nitride based on a total mass of the nitride and the silicon-containing compound.

Example 8

A phosphor precursor particle and a fired product (phosphor) according to Example 8 may be obtained according to the same method as Example 1 except for respectively weighing 3.354 g of a silicon nitride particle, 8.359 g of strontium nitrate, and 9.597 g of europium nitrate 6 hydrate to obtain a nitride represented by the formula $Eu_{0.3}Sr_{1.7}Si_5N_8$.

As a result of performing the same measurement and analysis as Example 1, the volume average particle diameter (D50v) of the phosphor precursor particle according to Example 8 is 125 nm. In addition, the fired product according to Example 8 may be excited by light of a wavelength ranging from 200 nm to 550 nm and has a photoluminescence peak wavelength of 661 nm. Accordingly, the fired product of Example 8 is a phosphor excited by visible light and emitting red light. In addition, in the fired product according to Example 8, a nitride having the same crystal structure as a material represented by the formula $Sr_2Si_5N_8$ and a silicon-containing compound having the same crystal structure as a material represented by the formula $Sr_2SiO_4$ are generated. Furthermore, the nitride is generated in an amount of 81 mass % and the silicon-containing compound is generated in an amount of 19 mass % based on a total amount of the nitride and the silicon-containing compound. In addition, the fired product of Example 8 includes Sr and Eu in a mole ratio of Sr:Eu=0.85:0.15. Furthermore, the fired product of Example 8 has a volume average particle diameter (D50v) of 163 nm and a volume average particle distribution index (PSDv) of 1.30. In addition, the fired product of Example 8 has an internal quantum efficiency of 75% at an excitation wavelength of 450 nm.

As described above, the phosphor according to Example 8 includes the nitride containing Sr, Eu, and Si. The phosphor is represented by the formula $Eu_{0.3}Sr_{1.7}Si_5N_8$. The phosphor includes 85 mol % of Sr and 15 mol % of Eu based on a total mole amount of Sr and Eu. On the other hand, the nitride has the same crystal structure as a material represented by the formula $Sr_2Si_5N_8$. The phosphor has a volume average particle diameter (D50v) of 163 nm and a volume average particle distribution index (PSDv) of 1.30. The phosphor has an internal quantum efficiency of 75% at an excitation wavelength of 450 nm. The phosphor includes 81 mass % of the nitride based on a total mass of the nitride and the silicon-containing compound.

Example 9

A phosphor precursor particle and a fired product (phosphor) according to Example 9 are obtained according to the same method as Example 1 except for respectively weighing a silicon nitride particle of 3.354 g, strontium nitrate of 12.92 g, and europium nitrate 6 hydrate of 1.418 g to obtain nitride represented by the formula $Eu_{0.05}Sr_{1.95}Si_5N_8$.

As a result of performing the same measurement and analysis as Example 1, the volume average particle diameter (D50v) of the phosphor precursor particle according to Example 9 is 128 nm. In addition, the fired product according to Example 9 may be excited by light of a wavelength ranging from 200 nm to 550 nm and has a photoluminescence peak wavelength of 650 nm. Accordingly, the fired product according to Example 9 is a phosphor excited by visible light and emitting red light. In addition, in the fired product of Example 9, a nitride having the same crystal structure as a material represented by the formula $Sr_2Si_5N_8$ and a silicon-containing compound having the same crystal structure as a material represented by the formula $Sr_2SiO_4$ are generated. In addition, the nitride is generated in an amount of 80 mass % and the silicon-containing compound is generated in an amount of 20 mass % based on a total mass of the nitride and the silicon-containing compound. Furthermore, the fired product according to Example 9 includes Sr and Eu in a mole ratio of Sr:Eu=0.975:0.025. In addition, the fired product of Example 9 has a volume average particle diameter (D50v) of 155 nm and a volume average particle distribution index (PSDv) of 1.29. In addition, the fired product of Example 9 has an internal quantum efficiency of 74% at an excitation wavelength of 450 nm.

As described above, the phosphor of Example 9 includes the nitride containing Sr, Eu, and Si. The phosphor is represented by the formula $Eu_{0.05}Sr_{1.95}Si_5N_8$. The phosphor includes Sr of 97.5 mol % and Eu of 2.5 mol % based on a total mole amount of Sr and Eu. On the other hand, the nitride has the same crystal structure as a material represented by the formula $Sr_2Si_5N_8$. The phosphor has a volume average particle diameter (D50v) of 155 nm and a volume average particle distribution index (PSDv) of 1.29. The phosphor has an internal quantum efficiency of 74% at an excitation wavelength of 450 nm. The phosphor includes 80 mass % of the nitride based on a total mass of the nitride and the silicon-containing compound.

Example 10

A phosphor precursor particle and a fired product (phosphor) according to Example 10 are obtained according to the same method as Example 1 except for using a silicon nitride particle having a volume average particle diameter (D50v) of 110 nm obtained by pulverizing crystalline silicon nitride (Kojundo Co., Ltd.) having a number average particle diameter of 500 nm with a fine grinder (LMZ015, Ashizawa Finetech Ltd.) as a raw material.

As a result of performing the same measurement and analysis as Example 1, the volume average particle diameter (D50v) of the phosphor precursor particle according to Example 10 is 196 nm. In addition, the fired product of Example 10 may be excited by light of a wavelength ranging from 200 nm to 550 nm and has a photoluminescence peak wavelength of 661 nm. Accordingly, the fired product of Example 10 is a phosphor excited by visible light and emitting red light. In addition, in the fired product of Example 10, a nitride having the same crystal structure as a material represented by the formula $Sr_2Si_5N_8$ and a silicon-containing compound having the same crystal structure as a material represented by the formula $Sr_2SiO_4$ are generated. Furthermore, the nitride is generated in an amount of 84 mass % and the silicon-containing compound is generated in an amount of 16 mass % based on a total mass of the nitride and the silicon-containing compound. In addition, the fired product of Example 10 includes Sr and Eu in a mole ratio of Sr:Eu=0.9:0.1. In addition, the fired product of Example 10 has a volume average particle diameter (D50v) of 298 nm and a volume average particle distribution index (PSDv) of 1.23. In addition, the fired product of Example 10 has an internal quantum efficiency of 79% at an excitation wavelength of 450 nm.

As described above, the phosphor of Example 10 includes the nitride containing Sr, Eu, and Si. The phosphor is represented by the formula $Eu_{0.2}Sr_{1.8}Si_5N_8$. The phosphor includes Sr of 90 mol % and Eu of 10 mol % based on a total mole amount of Sr and Eu. On the other hand, the nitride has the same crystal structure as a material represented by the formula $Sr_2Si_5N_8$. The phosphor has a volume average particle diameter (D50v) of 298 nm and a volume average particle distribution index (PSDv) of 1.23. The phosphor has an internal quantum efficiency of 79% at an excitation wavelength of 450 nm. The phosphor includes 84 mass % of the nitride based on a total mass of the nitride and the silicon-containing compound.

Example 11

A phosphor precursor particle and a fired product (phosphor) according to Example 11 are obtained according to the same method as Example 1 except for using an amorphous silicon nitride particle having a volume average particle diameter (D50v) of 25 nm (Hefei Kaier Nanometer Energy & Technology Co., Ltd.) as a raw material.

As a result of performing the measurement and analysis as Example 1, the volume average particle diameter (D50v) of the phosphor precursor particle of Example 11 is 56 nm. In addition, the fired product of Example 11 may be excited by light of a wavelength ranging from 200 nm to 550 nm and has a photoluminescence peak wavelength of 659 nm. Accordingly, the fired product of Example 11 is a phosphor excited by visible light and emitting red light. In addition, in the fired product of Example 11, a nitride having the same crystal structure as a material represented by the formula $Sr_2Si_5N_8$ and a silicon-containing compound having the same crystal structure as a material represented by the formula $Sr_2SiO_4$ are generated. Furthermore, the nitride is generated in an amount of 87 mass % and the silicon-containing compound is generated in an amount of 13 mass % based on a total mass of the nitride and the silicon-containing compound. In addition, the fired product of Example 11 includes Sr and Eu in a mole ratio of Sr:Eu=0.9:0.1. In addition, the fired product of Example 11 has a volume average particle diameter (D50v) of 108 nm and a volume average particle distribution index (PSDv) of 1.25. In addition, the fired product of Example 11 has an internal quantum efficiency of 73% at an excitation wavelength of 450 nm.

As described above, the phosphor of Example 11 includes the nitride containing Sr, Eu, and Si. The phosphor is represented by the formula $Eu_{0.2}Sr_{1.8}Si_5N_8$. The phosphor includes Sr of 90 mol % and Eu of 10 mol % based on a total mole amount of Sr and Eu. On the other hand, the nitride has the same crystal structure as a material represented by the formula $Sr_2Si_5N_8$. The phosphor has a volume average particle diameter (D50v) of 108 nm and a volume average particle distribution index (PSDv) of 1.25. The phosphor has an internal quantum efficiency of 73% at an excitation wavelength of 450 nm. The phosphor includes 87 mass % of the nitride based on a total mass of the nitride and the silicon-containing compound.

Example 12

3.354 g of a silicon nitride particle, 14.10 g of strontium nitrate, and 3.781 g of europium nitrate 6 hydrate are respectively weighed to obtain a nitride represented by the formula $Eu_{0.2}Sr_{1.8}Si_5N_8$. Accordingly, the phosphor precursor particle and its suspension liquid have a mole ratio of 1:1.1 between a total mole amount of Sr and Eu and a mole amount of the silicon.

Except for the above, a phosphor precursor particle and a fired product (phosphor) according to Example 12 are obtained according to the same method as Example 1.

As a result of performing the same measurement and analysis as Example 1, the volume average particle diameter (D50v) of the phosphor precursor particle according to Example 12 is 125 nm. In addition, the fired product according to Example 12 may be excited by light of a wavelength ranging from 200 nm to 550 nm and has a photoluminescence peak wavelength of 660 nm. Accordingly, the fired product of Example 12 is a phosphor excited by visible light and emitting red light. In addition, in the fired product of Example 12, a nitride having the same crystal structure as a material represented by the formula $Sr_2Si_5N_8$ and a silicon-containing compound having the same crystal structure as a material represented by the formula $Sr_2SiO_4$ are generated. Furthermore, the nitride is generated in an amount of 82 mass % and the silicon-containing compound is generated in an amount of 18 mass % based on a total mass of the nitride and the silicon-containing compound. In addition, the fired product of Example 12 includes Sr and Eu in a mole ratio of Sr:Eu=0.9:0.1. Furthermore, the fired product of Example 12 has a volume average particle diameter (D50v) of 162 nm and a volume average particle distribution index (PSDv) of 1.25. In addition, the fired product of Example 12 has an internal quantum efficiency of 72% at an excitation wavelength of 450 nm.

As described above, the phosphor of Example 12 includes the nitride containing Sr, Eu, and Si. The phosphor is represented by the formula $Eu_{0.2}Sr_{1.8}Si_5N_8$. The phosphor includes 90 mol % of Sr and 10 mol % of Eu based on a total mole amount of Sr and Eu. On the other hand, the nitride has the same crystal structure as a material represented by the formula $Sr_2Si_5N_8$. The phosphor has a volume average particle diameter (D50v) of 162 nm and a volume average particle distribution index (PSDv) of 1.25. The phosphor has an internal quantum efficiency of 72% at an excitation wavelength of 450 nm. The phosphor includes 82 mass % of the nitride based on a total mass of the nitride and the silicon-containing compound.

Example 13

3.354 g of a silicon nitride particle, 10.34 g of strontium nitrate, and 2.772 g of europium nitrate 6 hydrate are respectively weighed to obtain nitride represented by the formula $Eu_{0.2}Sr_{1.8}Si_5N_8$. Accordingly, the phosphor precursor particle and its suspension liquid have a mole ratio of 1:1.5 between a total mole amount of Sr and Eu and a mole amount of silicon.

Other than the above, a phosphor precursor particle and a fired product (phosphor) of Example 13 are obtained according to the same method as Example 1.

As a result of performing the same measurement and analysis as Example 1, the volume average particle diameter (D50v) of the phosphor precursor particle of Example 13 is 115 nm. In addition, the fired product of Example 13 may be excited by light of a wavelength ranging from 200 nm to 550 nm and has a photoluminescence peak wavelength of 660 nm. Accordingly, the fired product of Example 13 is a phosphor excited by visible light and emitting red light. In addition, in the fired product of Example 13, a nitride having the same crystal structure as a material represented by the formula $Sr_2Si_5N_8$ and a silicon-containing compound having the same crystal structure as a material represented by the formula $Sr_2SiO_4$ are generated. In addition, the nitride is generated in an amount of 78 mass % and the silicon-containing compound is generated in an amount of 22 mass % based on a total mass of the nitride and the silicon-containing compound. Furthermore, the fired product of Example 13 includes Sr and Eu in a mole ratio of Sr:Eu=0.9:0.1. In addition, the fired product of Example 13 has a volume average particle diameter (D50v) of 143 nm and a volume average particle distribution index (PSDv) of 1.22. In addition, the fired product of Example 13 has an internal quantum efficiency of 74% at an excitation wavelength of 450 nm.

As described above, the phosphor of Example 13 includes the nitride containing Sr, Eu, and Si. The phosphor is represented by the formula $Eu_{0.2}Sr_{1.8}Si_5N_8$. The phosphor includes 90 mol % of Sr and 10 mol % of Eu based on a total mole amount of Sr and Eu. On the other hand, the nitride has the same crystal structure as a material represented by the formula $Sr_2Si_5N_8$. The phosphor has a volume average particle diameter (D50v) of 143 nm and a volume average particle distribution index (PSDv) of 1.22. The phosphor has an internal quantum efficiency of 74% at an excitation wavelength of 450 nm. The phosphor includes 78 mass % of the nitride based on a total mass of the nitride and the silicon-containing compound.

Comparative Example 1

A phosphor precursor particle and a fired product (phosphor) according to Comparative Example 1 are obtained according to the same method as Example 1 except for using a crystalline silicon nitride particle having a volume average particle diameter (D50v) of 195 nm (Ube Industries Ltd.) as a raw material.

As a result of performing the same measurement and analysis as Example 1, the volume average particle diameter (D50v) of the phosphor precursor particle of Comparative Example 1 is 305 nm. In addition, the fired product of Comparative Example 1 may be excited by light of a wavelength ranging from 200 nm to 550 nm and has a photoluminescence peak wavelength of 661 nm. Accordingly, the fired product of Comparative Example 1 is a phosphor excited by visible light. In addition, in the fired product of Comparative Example 1, a nitride having the same crystal structure as a material represented by the formula $Sr_2Si_5N_8$ and a silicon-containing compound having the same crystal structure as a material represented by the formula $Sr_2SiO_4$. Furthermore, the nitride is generated in an amount of 80 mass % and the silicon-containing compound is generated in an amount of 20 mass % based on a total mass of the nitride and the silicon-containing compound. In addition, the fired product of Comparative Example 1 includes Sr and Eu in a mole ratio of Sr:Eu=0.9:0.1. Furthermore, the fired product of Comparative Example 1 has a volume average particle diameter (D50v) of 465 nm and a volume average particle distribution index (PSDv) of 1.43. In addition, the fired product of Comparative Example 1 has an internal quantum efficiency of 76% at an excitation wavelength of 450 nm.

As described above, the phosphor of Comparative Example 1 includes the nitride containing Sr, Eu, and Si. The phosphor is represented by the formula $Eu_{0.2}Sr_{1.8}Si_5N_8$. The phosphor includes 90 mol % of Sr and 10 mol % of Eu based on a total mole amount of Sr and Eu. On the other hand, the nitride has the same crystal structure as a material represented by the formula $Sr_2Si_5N_8$. The phosphor has a volume average particle diameter (D50v) of 465 nm and a volume average particle distribution index (PSDv) of 1.43. The phosphor has an internal quantum efficiency of 76% at an excitation wavelength of 450 nm. The phosphor includes 80 mass % of the nitride based on a total mass of the nitride and the silicon-containing compound.

Comparative Example 2

A phosphor precursor particle according to Comparative Example 2 is obtained according to the same method as Example 1. A fired product (phosphor) of Comparative Example 2 is obtained according to the same method as Example 1 except for firing the phosphor precursor particle under a nitrogen gas atmosphere of 100 volume %.

As a result of performing the same measurement and analysis as Example 1, the volume average particle diameter (D50v) of the phosphor precursor particle of Comparative Example 2 is 120 nm. In addition, the fired product of Comparative Example 2 may be excited by light of a wavelength ranging from 200 nm to 550 nm and has a photoluminescence peak wavelength of 557 nm. Accordingly, the fired product of Comparative Example 2 is a phosphor excited by visible light and emitting yellowish-green light. In addition, in the fired product of Comparative Example 2, a nitride having the same crystal structure as a material represented by the formula $Sr_2Si_5N_8$ and a silicon-containing compound having the same crystal structure as a material represented by the formula $Sr_2SiO_4$ are generated. In addition, the nitride is generated in an amount of 14 mass % and the silicon-containing compound is generated in an amount of 86 mass % based on a total amount of the nitride and the silicon-containing compound. In addition, the fired product of Comparative Example 2 includes Sr and Eu in a mole ratio of Sr:Eu=0.9:0.1. Furthermore, the fired product of Comparative Example 2 has a volume average particle diameter (D50v) of 177 nm and a volume average particle distribution index (PSDv) of 1.31. In addition, the fired product of Comparative Example 2 has an internal quantum efficiency of 50% at an excitation wavelength of 450 nm.

As described above, the phosphor according to Comparative Example 2 includes the nitride containing Sr, Eu, and Si. The phosphor is represented by the formula $Eu_{0.2}Sr_{1.8}Si_5N_8$. The phosphor includes 90 mol % of Sr and 10 mol % of Eu based on a total mole amount of Sr and Eu. On the other hand, the nitride has the same crystal structure as a material represented by the formula $Sr_2Si_5N_8$. The phosphor has a volume average particle diameter (D50v) of 177 nm and a volume average particle distribution index (PSDv) of 1.31. The phosphor has an internal quantum efficiency of 50% at an excitation wavelength of 450 nm. The phosphor includes 14 mass % of the nitride based on a total mass of the nitride and the silicon-containing compound.

Comparative Example 3

A phosphor precursor particle according to Comparative Example 3 is obtained according to the same method as Example 1. A fired product of Comparative Example 3 is obtained according to the same method as Example 1 except for firing the phosphor precursor particle at 1100° C.

As a result of performing the same measurement and analysis as Example 1, the volume average particle diameter (D50v) of the phosphor precursor particle of Comparative Example 3 is 123 nm. An excited luminescence spectrum of the fired product according to Comparative Example 3 is measured, but light is not emitted from the fired product. The reason that no light is emitted is due to lack of firing because of the low firing temperature. In other words, a phosphor is not obtained in Comparative Example 3.

Comparative Example 4

A phosphor precursor particle of Comparative Example 4 is obtained according to the same method as Example 1. A fired product (phosphor) according to Comparative Example 4 is obtained according to the same method as Example 1 except for firing the phosphor precursor particle at 1700° C.

As a result of performing the same measurement and analysis as Example 1, the volume average particle diameter (D50v) of the phosphor precursor particle of Comparative Example 4 is 118 nm. In addition, the fired product of Comparative Example 4 may be excited by light of a wavelength ranging from 200 nm to 550 nm and has a photoluminescence peak wavelength of 661 nm. Accordingly, the fired product of Comparative Example 4 is a phosphor excited by visible light and emitting red light. In addition, in the fired product of Comparative Example 4, a nitride having the same crystal structure as a material represented by the formula $Sr_2Si_5N_8$ and a silicon-containing compound having the same crystal structure as a material represented by the formula $Sr_2SiO_4$ are generated. Furthermore, the nitride is generated in an amount of 94 mass % and the silicon-containing compound is generated in an amount of 6 mass % based on a total mass of the nitride and the silicon-containing compound. In addition, the fired product of Comparative Example 4 includes Sr and Eu in a mole ratio of Sr:Eu=0.9:0.1. In addition, the fired product of Comparative Example 4 has a volume average particle diameter (D50v) of 10320 nm and a volume average particle distribution index (PSDv) of 1.45. In addition, the fired product of Comparative Example 4 has an internal quantum efficiency of 81% at an excitation wavelength of 450 nm.

As described above, a phosphor according to Comparative Example 4 includes the nitride containing Sr, Eu, and Si. The phosphor is represented by the formula $Eu_{0.2}Sr_{1.8}Si_5N_8$. The phosphor includes 90 mol % of Sr and 10 mol % of Eu based on a total mole amount of Sr and Eu. On the other hand, the nitride has the same crystal structure as a material represented by the formula $Sr_2Si_5N_8$. The phosphor has a volume average particle diameter (D50v) of 10320 nm and a volume average particle distribution index (PSDv) of 1.45. The phosphor has an internal quantum efficiency of 81% at an excitation wavelength of 450 nm. The phosphor includes 94 mass % of nitride based on a total mass of the nitride and the silicon-containing compound.

Comparative Example 5

A phosphor precursor particle according to Comparative Example 5 is obtained according the same method as Example 2. The phosphor precursor particle is fired in the same firing method as Example 1 except for changing the firing temperature to 1700° C.

As a result of performing the same measurement and analysis as Example 1, the volume average particle diameter (D50v) of the phosphor precursor particle of Comparative Example 5 is 113 nm. However, the phosphor precursor particle of Comparative Example 5 melts during the firing so that a fired product and a phosphor are not obtained. The reason is that a large amount of calcium is contained in the phosphor precursor particle and lowers a melting point of a nitride synthesized during the firing.

Comparative Example 6

A phosphor precursor particle according to Comparative Example 6 is obtained according to the same method as Example 2 except for respectively weighing 3.354 g of a silicon nitride particle, 1.256 g of strontium nitrate, 11.91 g of calcium nitrate 4 hydrate, and 3.199 g of europium nitrate 6 hydrate to obtain a nitride represented by the formula $Eu_{0.2}Sr_{0.2}Ca_{1.6}Si_5N_8$. The phosphor precursor particle is fired according to the same method as Example 1.

As a result of performing the same measurement and analysis as Example 1, the volume average particle diameter (D50v) of the phosphor precursor particle of Comparative Example 6 is 116 nm. However, the phosphor precursor particle according to Comparative Example 6 melts during firing so that a fired product and a phosphor are not obtained. The reason is that a large amount of calcium is contained in the phosphor precursor particle and lowers a melting point of a nitride synthesized during the firing.

Comparative Example 7

A phosphor precursor particle and a fired product (phosphor) according to Comparative Example 7 are obtained according to the same method as Example 1 except for respectively weighing 3.354 g of a silicon nitride particle, 13.53 g of strontium nitrate, and 0.3199 g of europium nitrate 6 hydrate to obtain a nitride represented by the formula $Eu_{0.01}Sr_{1.99}Si_5N_8$.

As a result of performing the same measurement and analysis as Example 1, the volume average particle diameter (D50v) of the phosphor precursor particle according to Comparative Example 7 is 122 nm. In addition, the fired product according to Comparative Example 7 may be excited by light of a wavelength ranging from 200 nm to 550 nm and has a photoluminescence peak wavelength of 660 nm. Accordingly, the fired product of Comparative Example 7 is a phosphor excited by visible light and emitting red light. In addition, in the fired product according to Comparative Example 7, a nitride having the same crystal structure as a material represented by the formula $Sr_2Si_5N_8$, and a silicon-containing compound having the same crystal structure as a material represented by the formula $Sr_2SiO_4$ are generated. Furthermore, the nitride is generated in an amount of 82 mass % and the silicon-containing compound is generated in an amount of 18 mass % based on a total mass of the nitride and the silicon-containing compound. In addition, the fired product of Comparative Example 7 includes Sr and Eu in a mole ratio of Sr:Eu=0.995:0.005. In addition, the fired product of Comparative Example 7 has a volume average particle diameter (D50v) of 180 nm and a volume average particle distribution index (PSDv) of 1.31. In addition, the fired product of Comparative Example 7 has an internal quantum efficiency of 45% at an excitation wavelength of 450 nm.

As described above, the phosphor according to Comparative Example 7 includes the nitride containing Sr, Eu, and Si. The phosphor is represented by the formula $Eu_{0.01}Sr_{1.99}Si_5N_8$. The phosphor includes Sr of 99.5 mol % and Eu of 0.5 mol % based on a total mole amount of Sr and Eu. On the other hand, the nitride has the same crystal structure as a material represented by the formula $Sr_2Si_5N_8$. The phosphor has a volume average particle diameter (D50v) of 180 nm and a volume average particle distribution index (PSDv) of 1.31. The phosphor has an internal quantum efficiency of 45% at an excitation wavelength of 450 nm. The phosphor includes the nitride of 82 mass % based on a total mass of the nitride and the silicon-containing compound.

Comparative Example 8

A phosphor precursor particle and a fired product (phosphor) according to Comparative Example 7 are obtained according to the same method as Example 1 except for respectively weighing 3.354 g of a silicon nitride particle, 4.781 g of strontium nitrate, and 15.995 g of europium nitrate 6 hydrate to obtain a nitride represented by the formula $Eu_{0.5}Sr_{1.5}Si_5N_8$.

As a result of performing the same measurement and analysis as Example 1, the volume average particle diameter (D50v) of the phosphor precursor particle according to Comparative Example 8 is 131 nm. In addition, the fired product of Comparative Example 8 may be excited by light of a wavelength ranging from 200 nm to 550 nm and has a photoluminescence peak wavelength of 661 nm. Accordingly, the fired product of Comparative Example 8 is a phosphor excited by visible light and emitting red light. In addition, in the fired product according to Comparative Example 8, a nitride having the same crystal structure as a material represented by the formula $Sr_2Si_5N_8$ and a silicon-containing compound having the same crystal structure as a material represented by the formula $Sr_2SiO_4$ are generated. In addition, the nitride is generated in an amount of 85 mass % and the silicon-containing compound is generated in an amount of 15 mass % based on a total mass of the nitride and the silicon-containing compound. In addition, the fired product according to Comparative Example 8 includes Sr and Eu in a mole ratio of Sr:Eu=0.75:0.25. In addition, the fired product according to Comparative Example 8 has a volume average particle diameter (D50v) of 175 nm and a volume average particle distribution index (PSDv) of 1.30. In addition, the fired product according to Comparative Example 8 has an internal quantum efficiency of 39% at an excitation wavelength of 450 nm.

As described above, a phosphor according to Comparative Example 8 includes the nitride containing Sr, Eu, and Si. The phosphor is represented by the formula $Eu_{0.5}Sr_{1.5}Si_5N_8$. The phosphor includes Sr of 75 mol % and Eu of 25 mol % based on a total mole amount of Sr and Eu. On the other hand, the nitride has the same crystal structure as a material represented by the formula $Sr_2Si_5N_8$. The phosphor has a volume average particle diameter (D50v) of 175 nm and a volume average particle distribution index (PSDv) of 1.30. The phosphor has an internal quantum efficiency of 39% at an excitation wavelength of 450 nm. The phosphor includes the nitride of 85 mass % based on a total mass of the nitride and the silicon-containing compound.

Comparative Example 9

The fired product (phosphor) according to Comparative Example 4 is pulverized with a bead mill to obtain a sub-micron sized phosphor.

As a result of performing the same measurement and analysis as Example 1, the volume average particle diameter (D50v) of the phosphor precursor particle according to Comparative Example 9 is 131 nm. In addition, the fired product of Comparative Example 9 may be excited by light of a wavelength ranging from 200 nm to 550 nm and has a photoluminescence peak wavelength of 658 nm. In addition, a part of a nitride crystal and a part of a silicon-containing compound crystal in the phosphor become amorphous after the pulverization. Accordingly, a content of the silicon-containing compound according to Comparative Example 9 is not shown in Table 2. In addition, the phosphor after the pulverization has a volume average particle diameter (D50v) of 285 nm and a volume average particle distribution index (PSDv) of 1.32. Furthermore, the phosphor after the pulverization has an internal quantum efficiency of 36% at an excitation wavelength of 450 nm.

Comparative Example 10

3.354 g of a silicon nitride particle, 16.33 g of strontium nitrate, and 4.378 g of europium nitrate 6 hydrate are respectively weighed to obtain a nitride represented by the formula $Eu_{0.2}Sr_{1.8}Si_5N_8$. Accordingly, a phosphor precursor particle and its suspension liquid have a mole ratio of 1:0.95 between a total mole amount of Sr and Eu and a mole amount of silicon.

Other than the above, a phosphor precursor particle and a fired product (phosphor) according to Comparative Example 10 are obtained according to the same method as Example 1.

As a result of performing the same measurement and analysis as Example 1, the volume average particle diameter (D50v) of the phosphor precursor particle of Comparative Example 10 is 135 nm. In addition, the fired product of Comparative Example 10 may be excited by light of a wavelength ranging from 200 nm to 550 nm and has a photoluminescence peak wavelength of 555 nm. Accordingly, the fired product of Comparative Example 10 is a phosphor excited by visible light and emitting yellowish-green light. In addition, in the fired product of Comparative Example 10, a nitride having the same crystal structure as a material represented by the formula $Sr_2Si_5N_8$ and a silicon-containing compound having the same crystal structure as a material represented by the formula $Sr_2SiO_4$ are generated. In addition, the nitride is generated in an amount of 40 mass % and the silicon-containing compound is generated in an amount of 60 mass % based on a total mass of the nitride and the silicon-containing compound. In addition, the fired product of Comparative Example 10 includes Sr and Eu in a mole ratio of Sr:Eu=0.9:0.1. Furthermore, the fired product of Comparative Example 10 has a volume average particle diameter (D50v) of 205 nm and a volume average particle distribution index (PSDv) of 1.43. In addition, the fired product of Comparative Example 10 has an internal quantum efficiency of 53% at an excitation wavelength of 450 nm.

As described above, a phosphor of Comparative Example 10 includes the nitride containing Sr, Eu, and Si. The phosphor is represented by the formula $Eu_{0.2}Sr_{1.8}Si_5N_8$. The phosphor includes Sr of 90 mol % and Eu of 10 mol % based on a total mole amount of Sr and Eu. On the other hand, the nitride has the same crystal structure as a material represented by the formula $Sr_2Si_5N_8$. The phosphor has a volume average particle diameter (D50v) of 205 nm and a volume average particle distribution index (PSDv) of 1.43. The phosphor has an internal quantum efficiency of 53% at an excitation wavelength of 450 nm. The phosphor includes the nitride of 40 mass % based on a total mass of the nitride and the silicon-containing compound.

Comparative Example 11

3.354 g of a silicon nitride particle, 9.40 g of strontium nitrate, and 2.520 g of europium nitrate 6 hydrate are respectively weighed to obtain a nitride represented by the formula $Eu_{0.2}Sr_{1.8}Si_5N_8$. Accordingly, the phosphor precursor particle and its suspension liquid have 1:1.65 of a mole ratio between a total mole amount of Sr and Eu and a mole amount of silicon.

Other than the above, a phosphor precursor particle and a fired product (phosphor) according to Comparative Example 11 are obtained according to the same method as Example 1.

As a result of performing the same measurement and analysis as Example 1, the volume average particle diameter (D50v) of the phosphor precursor particle according to Comparative Example 11 is 105 nm. In addition, the fired product according to Comparative Example 11 may be excited by light of a wavelength ranging from 200 nm to 550 nm and has a photoluminescence peak wavelength of 550 nm. Accordingly, the fired product of Comparative Example 11 is a phosphor excited by visible light and emitting yellowish-green light. In addition, in the fired product of Comparative Example 11, a nitride having the same crystal structure as a material represented by the formula $Sr_2Si_5N_8$ and a silicon-containing compound having the same crystal structure as a material represented by the formula $SrSi_2O_2N_2$ are generated. Furthermore, the nitride is generated in an amount of 42 mass % and the silicon-containing compound is generated in an amount of 58 mass % based on a total mass of the nitride and the silicon-containing compound. In addition, the fired product of Comparative Example 11 includes Sr and Eu in a mole ratio of Sr:Eu=0.9:0.1. In addition, the fired product of Comparative Example 11 has a volume average particle diameter (D50v) of 695 nm and a volume average particle distribution index (PSDv) of 1.58. In addition, the fired product of Comparative Example 11 has an internal quantum efficiency of 58% at an excitation wavelength 450 nm.

As described above, a phosphor of Comparative Example 11 includes the nitride containing Sr, Eu, and Si. The phosphor is represented by the formula $Eu_{0.2}Sr_{1.8}Si_5N_8$. The phosphor includes Sr of 90 mol % and Eu of 10 mol % based on a total mole amount of Sr and Eu. On the other hand, the nitride has the same crystal structure as a material represented by the formula $Sr_2Si_5N_8$. The phosphor has a volume average particle diameter (D50v) of 695 nm and a volume average particle distribution index (PSDv) of 1.58. The phosphor has an internal quantum efficiency of 58% at an excitation wavelength of 450 nm. The phosphor includes the nitride of 42 mass % based on a total mass of the nitride and the silicon-containing compound.

Comparison of Examples with Comparative Examples

Figure 4:
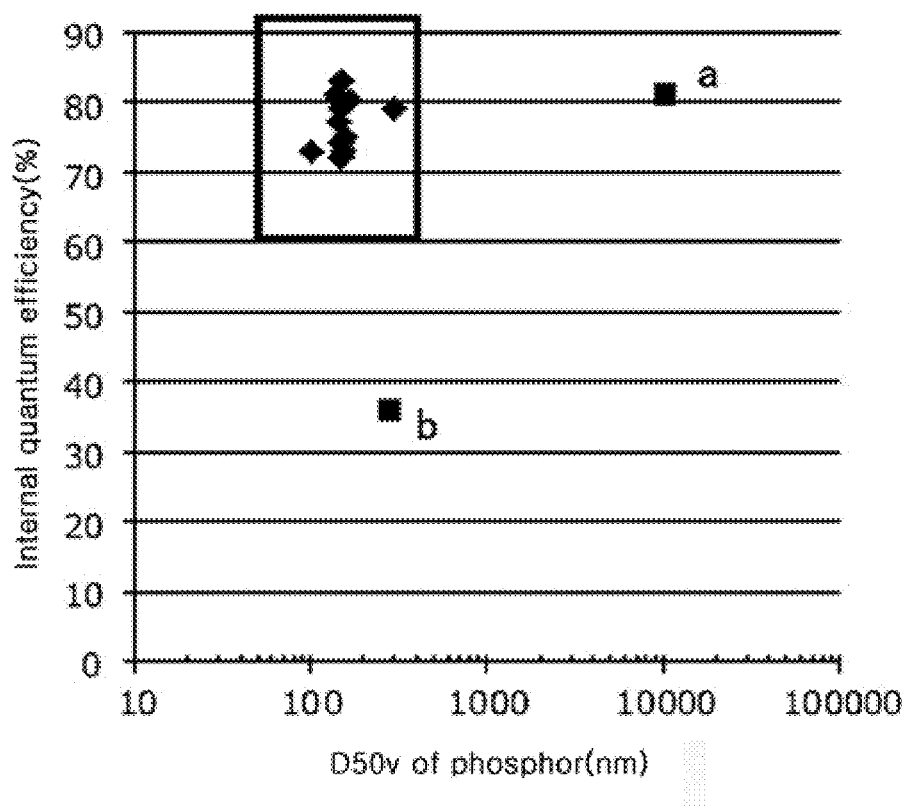
FIG. 4 is a graph showing a relationship between a volume average particle diameter of a phosphor and an internal quantum efficiency of the phosphor at an excitation wavelength of 450 nm.

FIG. 4 is a graph showing a relationship between a volume average particle diameter of a phosphor and an internal quantum efficiency of the phosphor at an excitation wavelength of 450 nm. In FIG. 4, a horizontal axis indicates a volume average particle diameter (D50v) of the phosphor, and a vertical axis indicates an internal quantum efficiency of the phosphor at an excitation wavelength of 450 nm. In FIG. 4, diamond-shaped points indicate Examples 1 to 13, and rectangular points a and b indicate Comparative Examples 4 and 9.

Referring to FIG. 4 and Table 2, the phosphors according to Examples 1 to 13 have a volume average particle diameter (D50v) ranging from 50 nm to 400 nm, for example, 100 nm to 300 nm, and also have an internal quantum efficiency of greater than or equal to 60%, for example, greater than or equal to 70%, at an excitation wavelength of 450 nm. Accordingly, a phosphor having excellent photoluminescence characteristics and simultaneously a small particle diameter is obtained in Examples 1 to 13. In particular, Examples 2, 3, and 5 show an internal quantum efficiency of greater than or equal to 80% at an excitation wavelength of 450 nm, and thus provide phosphors having excellent photoluminescence characteristics and also a small particle diameter.

On the other hand, the phosphor of Comparative Example 4 shows a high internal quantum efficiency of 81% at an excitation wavelength of 450 nm but has a relatively large volume average particle diameter (D50v) of 10320 nm. When the phosphor of Comparative Example 4 is pulverized, the phosphor may have a volume average particle diameter (D50v) reduced down to 285 nm of Comparative Example 9, but an internal quantum efficiency deteriorated to 36% at an excitation wavelength of 450 nm.

In addition, the phosphors according to Examples 1 to 13 have a volume average particle distribution index (PSDv) within a range of 1.20 to 1.35, for example, within a range of 1.21 to 1.31. In other words, a phosphor having a uniform particle diameter distribution may be obtained from Examples 1 to 13.

Figure 5:
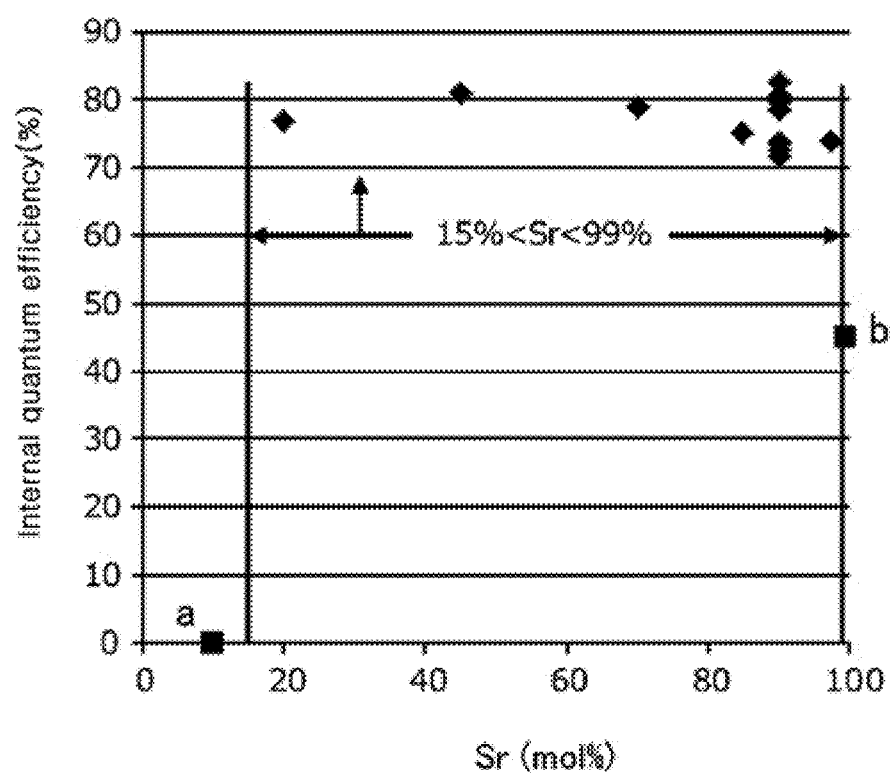
FIG. 5 is a graph showing a relationship between a Sr content of a phosphor and an internal quantum efficiency of the phosphor at an excitation wavelength of 450 nm.

FIG. 5 is a graph showing a relationship between a Sr content of a phosphor and an internal quantum efficiency of the phosphor at an excitation wavelength of 450 nm. In FIG. 5, a horizontal axis indicates a Sr content of the phosphor, and a vertical axis indicates an internal quantum efficiency of the phosphor at an excitation wavelength of 450 nm. In FIG. 5, diamond-shaped points indicate Examples 1 to 13, and rectangular points a and b indicate Comparative Examples 6 and 7.

Referring to FIG. 5 and Table 1, Comparative Example 6 includes a large amount of Ca and less than 15 mol % of Sr based on a total mole amount of an alkaline-earth metal element (Sr and Ca) and Eu. Accordingly, a nitride synthesized during firing has a decreased melting point and fails to obtain a phosphor. On the other hand, when the firing is performed at a lower temperature, the nitride may not be synthesized, an impurity such as a silicon-containing compound other impurities is increased, and thus an internal quantum efficiency at an excitation wavelength of 450 nm is deteriorated. In addition, the phosphor of Comparative Example 7 includes greater than 99 mol % of Sr and thus a relatively less amount of Eu and thus shows a deteriorated internal quantum efficiency at an excitation wavelength of 450 nm.

Accordingly, Sr should be included in an amount of 15 mol % to 99 mol % based on a total mole amount of an alkaline-earth metal element (Sr and Ca) and Eu. In addition, since the phosphors of Examples 1 to 13 have an internal quantum efficiency of greater than or equal to 60% at an excitation wavelength of 450 nm and include 20 mol % to 97.5 mol % of Sr based on a total mole amount of an alkaline-earth metal element (Sr and Ca) and Eu, Sr should be included in an amount of 20 mol % to 97.5 mol % based on the total mole amount of an alkaline-earth metal element (Sr and Ca) and Eu.

Figure 6:
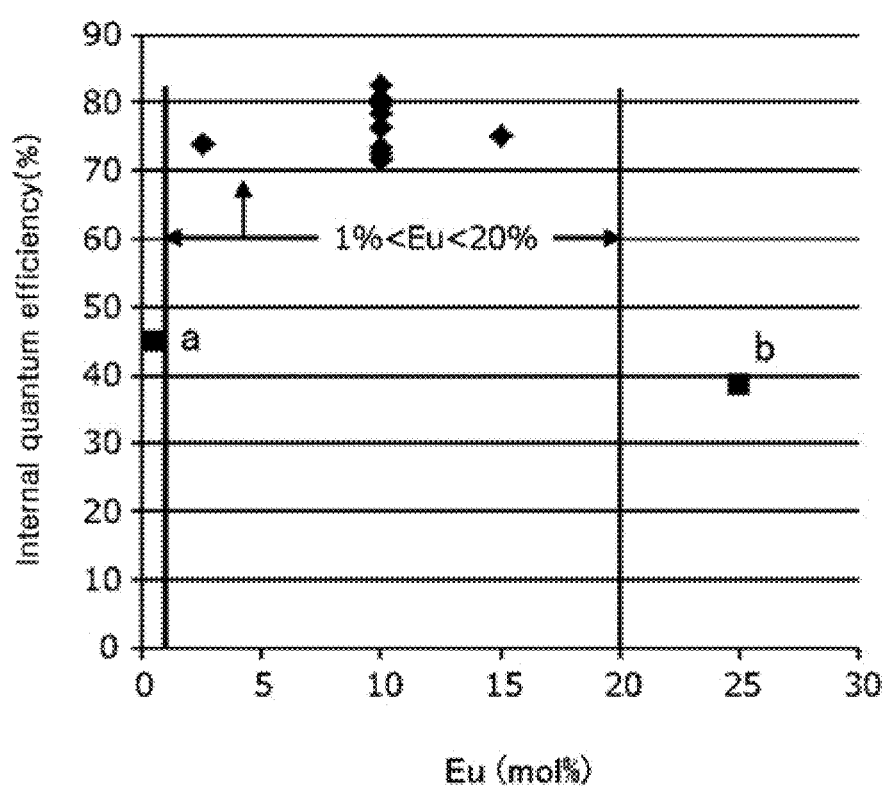
FIG. 6 is a graph showing a relationship between a Eu content of a phosphor and an internal quantum efficiency of the phosphor at an excitation wavelength of 450 nm.

FIG. 6 is a graph showing a relationship between a Eu content of a phosphor and an internal quantum efficiency of the phosphor at an excitation wavelength of 450 nm. In FIG. 6, a horizontal axis indicates a Eu content of the phosphor, and a vertical axis indicates an internal quantum efficiency of the phosphor at an excitation wavelength of 450 nm. In FIG. 6, diamond-shaped points indicate Examples 1 to 13, and rectangular points a and b indicate Comparative Examples 7 and 8.

Figure 7:
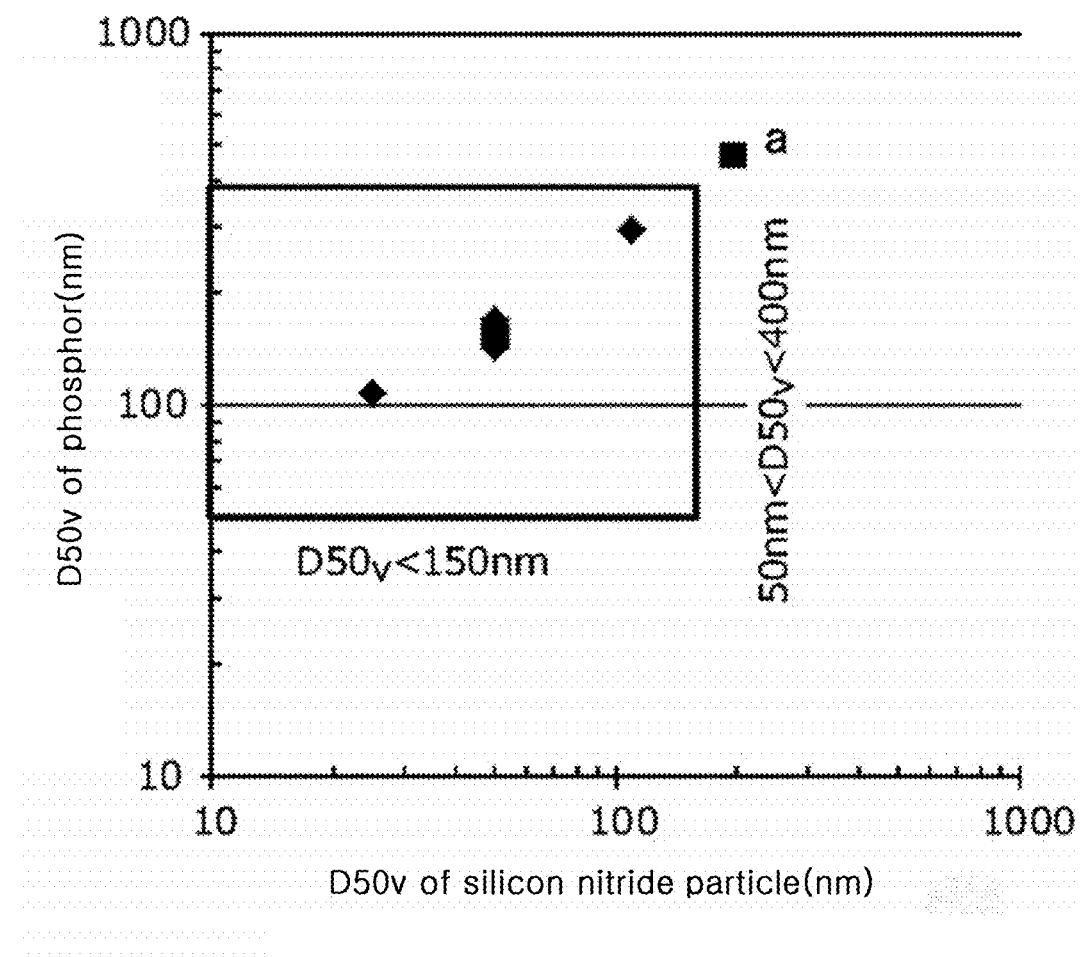
FIG. 7 is a graph showing a relationship between a volume average particle diameter of a silicon nitride particle and a volume average particle diameter of a phosphor.

Referring to FIG. 7 and Table 1, since the phosphor of Comparative Example 7 includes Eu in an amount of less than 1 mol % based on a total mole amount of an alkaline-earth metal element (Sr and Ca) and Eu, an internal quantum efficiency at an excitation wavelength of 450 nm is deteriorated. In addition, since the phosphor of Comparative Example 8 includes Eu in an amount of greater than 20 mol % and generates a concentration extinction phenomenon, an internal quantum efficiency at an excitation wavelength of 450 nm is deteriorated.

Accordingly, Eu should be included in an amount of 1 mol % to 20 mol % based on a total mole amount of an alkaline-earth metal element (Sr and Ca) and Eu. In addition, since the phosphors according to Examples 1 to 13 have an internal quantum efficiency of greater than or equal to 60% at an excitation wavelength of 450 nm and include Eu in an amount of 2.5 mol % to 15 mol % based on a total mole amount of an alkaline-earth metal element (Sr and Ca) and Eu, Eu should be included in an amount of 2.5 mol % to 15 mol % based on a total mole amount of an alkaline-earth metal element (Sr and Ca) and Eu.

FIG. 7 is a graph showing a relationship between a volume average particle diameter of a silicon nitride particle and a volume average particle diameter of a phosphor. In FIG. 7, a horizontal axis indicates a volume average particle diameter (D50v) of the silicon nitride particle, and a vertical axis indicates a volume average particle diameter (D50v) of the phosphor.

Figure 8:
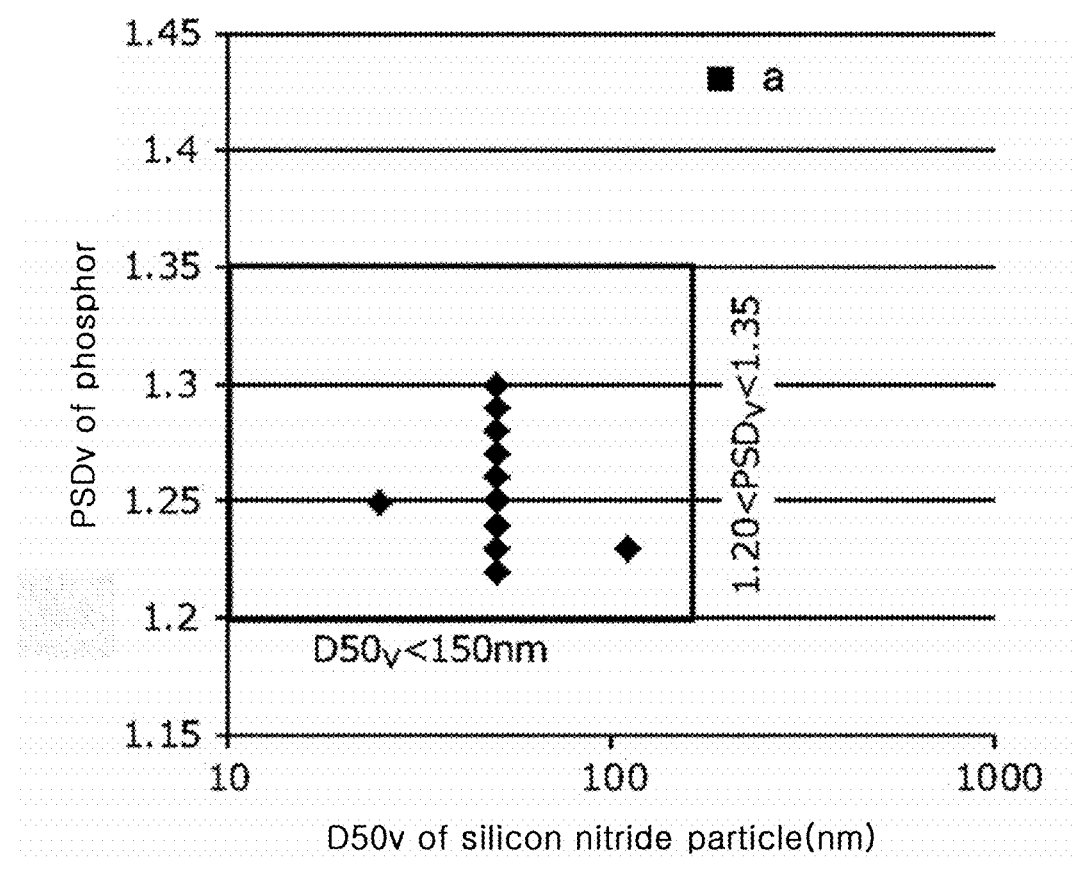
FIG. 8 is a graph showing a relationship between a volume average particle diameter of a silicon nitride particle and a volume average particle index of a phosphor.

FIG. 8 is a graph showing a relationship between a volume average particle diameter of the silicon nitride particle and a volume average particle index of the phosphor. In FIGS. 7 and 8, diamond-shaped points indicate Examples 1 to 13, and a rectangular point indicates Comparative Example 1.

Referring to FIG. 7 and Table 2, the phosphor of Comparative Example 1 has a silicon nitride particle having a volume average particle diameter (D50v) of greater than 150 nm, and thus the volume average particle diameter (D50v) of the phosphor precursor particle becomes relatively larger. As a result, the phosphor has a volume average particle diameter (D50v) of greater than 400 nm and thus does not have a particle diameter within a desirable range.

In addition, referring to FIG. 8 and Table 2, since a particle distribution of the phosphor according to Comparative Example 1 is difficult to control, the phosphor has a volume average particle distribution index (PSDv) of greater than 1.35. As a result, a phosphor having a target particle distribution is not obtained.

Accordingly, a silicon nitride particle should have a volume average particle diameter (D50v) of less than or equal to 150 nm. In addition, since the phosphors according to Examples 1 to 13 have a volume average particle diameter (D50v) in a range of 50 nm to 400 nm and a volume average particle distribution index (PSDv) in a range of 1.20 to 1.35 and include the silicon nitride particle having a volume average particle diameter (D50v) of less than or equal to 120 nm, the silicon nitride particle should have a volume average particle diameter (D50v) of less than or equal to 120 nm.

Figure 9:
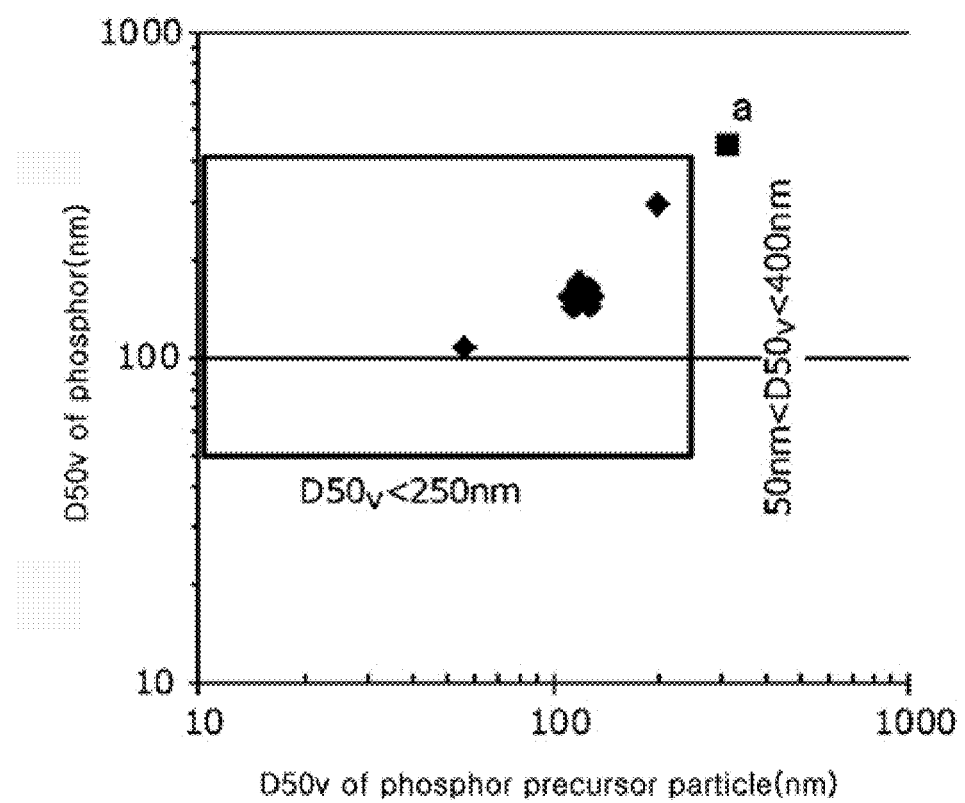
FIG. 9 is a graph showing a relationship between a volume average particle diameter of a phosphor precursor particle and a volume average particle diameter of a phosphor.
Figure 10:
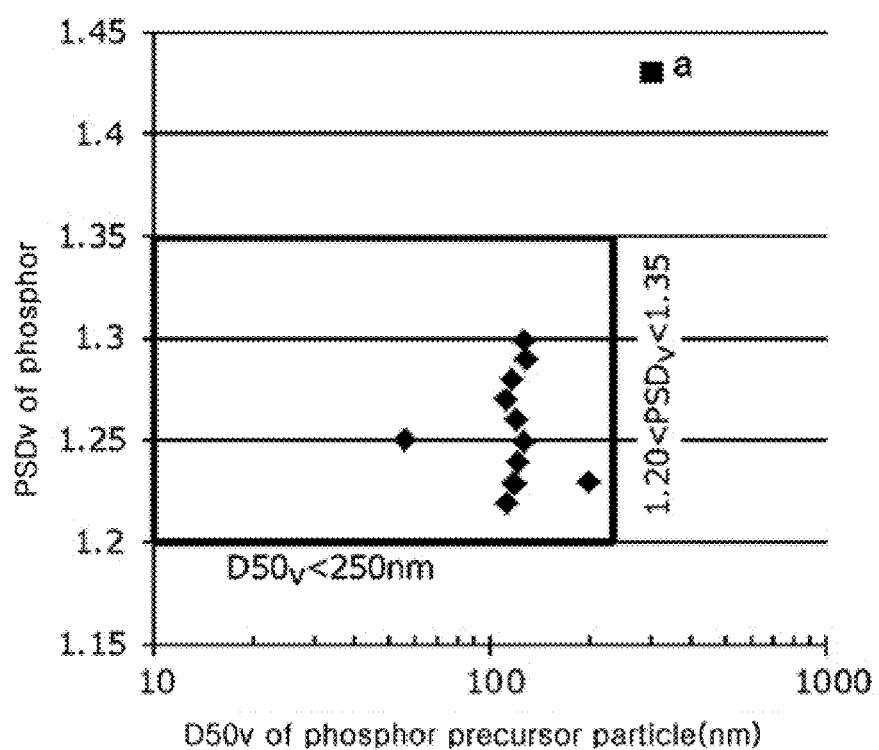
FIG. 10 is a graph showing a relationship between a volume average particle diameter of a phosphor precursor particle and a volume average particle index of a phosphor.

FIG. 9 is a graph showing a relationship between a volume average particle diameter of a phosphor precursor particle and a volume average particle diameter of a phosphor. In FIG. 9, a horizontal axis indicates the volume average particle diameter (D50v) of the phosphor precursor particle, and a vertical axis indicates the volume average particle diameter (D50v) of the phosphor. FIG. 10 is a graph showing a relationship between a volume average particle diameter of a phosphor precursor particle and a volume average particle index of a phosphor. In FIG. 10, a horizontal axis indicates the volume average particle diameter (D50v) of the phosphor precursor particle, and a vertical axis indicates the volume average particle distribution index (PSDv) of the phosphor. In FIGS. 9 and 10, diamond-shaped points indicate Examples 1 to 13, and a rectangular point indicates Comparative Example 1.

Referring to FIG. 9 and Table 2, since Comparative Example 1 shows greater than 250 nm of the volume average particle diameter (D50v) of the phosphor precursor particle and thus greater than 400 nm volume of the average particle diameter (D50v) of the phosphor, a phosphor having a particle diameter within a desirable range is not obtained.

In addition, referring to FIG. 10 and Table 2, since a particle distribution of the phosphor according to Comparative Example 1 is difficult to control, the phosphor has a volume average particle distribution index (PSDv) of greater than 1.35. As a result, the phosphor does not have a target particle distribution.

Accordingly, the volume average particle diameter (D50v) of the phosphor precursor particle should be less than or equal to 250 nm. In addition, the phosphors according to Examples 1 to 13 may be manufactured to have a volume average particle diameter (D50v) of less than 200 nm using a phosphor precursor particle having a volume average particle diameter (D50v) ranging from 50 nm to 400 nm and a volume average particle distribution index (PSDv) ranging from 1.20 to 1.35

Accordingly, the volume average particle diameter (D50v) of the phosphor precursor particle should be less than or equal to 200 nm.

Figure 11:
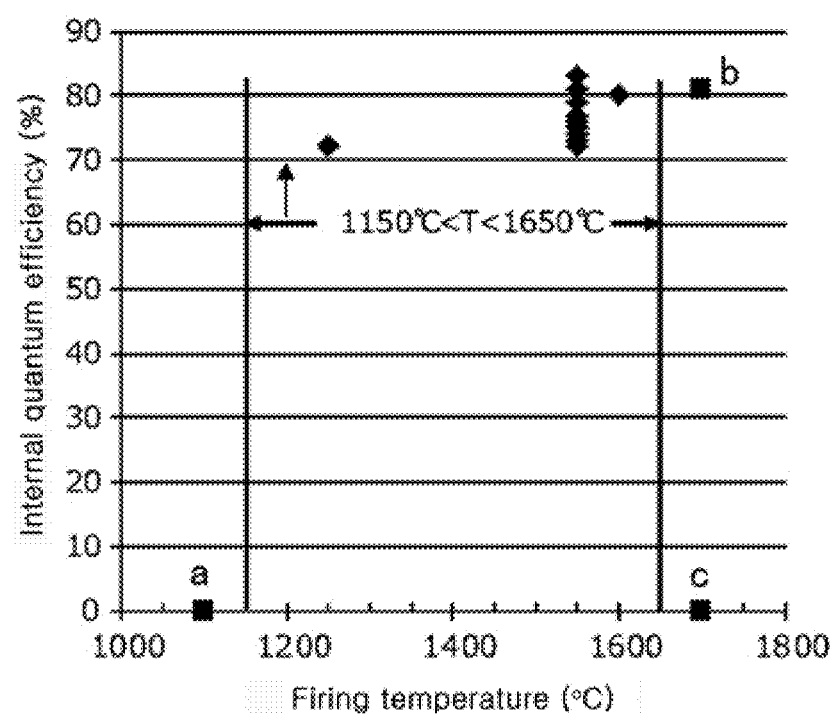
FIG. 11 is a graph showing a relationship between a firing temperature of a phosphor and an internal quantum efficiency of the phosphor at an excitation wavelength of 450 nm.

FIG. 11 is a graph showing a relationship between a firing temperature of a phosphor and an internal quantum efficiency of the phosphor at an excitation wavelength of 450 nm. In FIG. 11, a horizontal axis indicates a firing temperature of the phosphor, and a vertical axis indicates an internal quantum efficiency of the phosphor at an excitation wavelength of 450 nm.

In FIG. 11, diamond-shaped points indicate Examples 1 to 13, and rectangular points a to c sequentially respectively indicate Comparative Examples 3 to 5.

Figure 12:
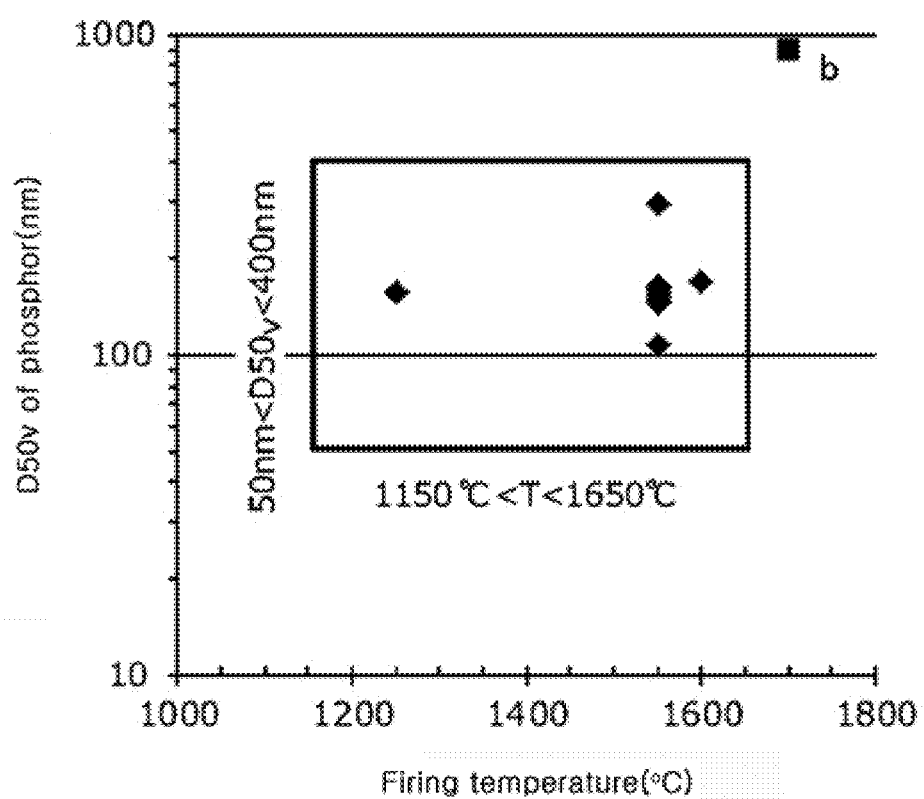
FIG. 12 is a graph showing a relationship between a firing temperature of a phosphor and a volume average particle diameter of the phosphor.

FIG. 12 is a graph showing a relationship between a firing temperature of a phosphor and a volume average particle diameter of the phosphor. In FIG. 12, a horizontal axis indicates the firing temperature, and a vertical axis indicates the volume average particle diameter (D50v) of the phosphor.

Figure 13:
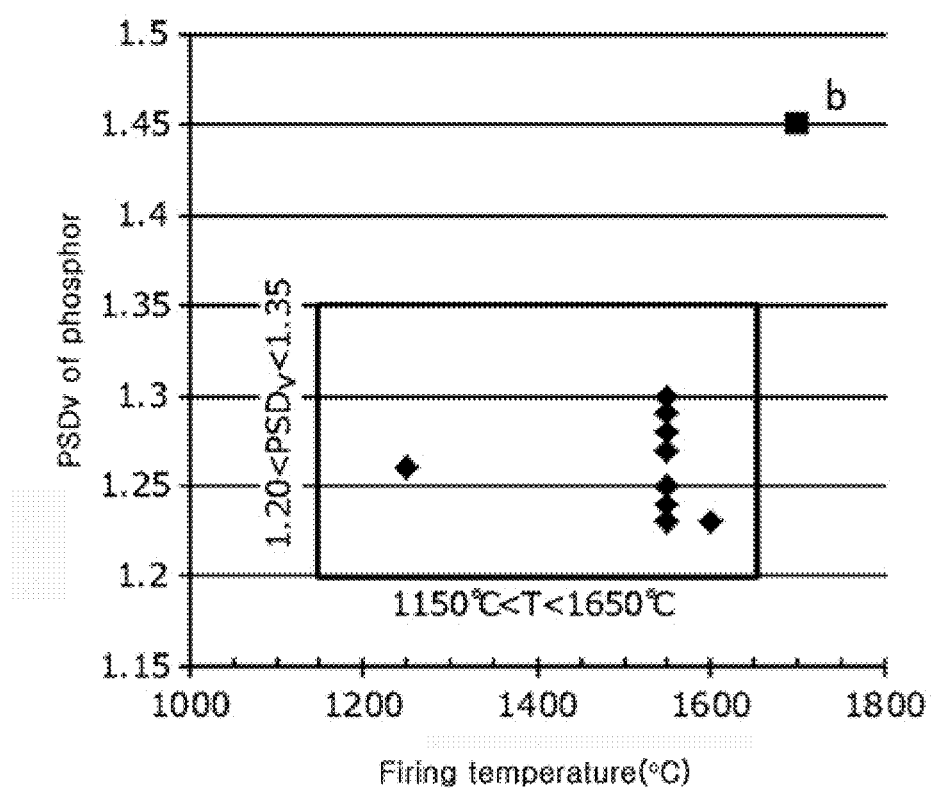
FIG. 13 is a graph showing a relationship between a firing temperature of a phosphor and a volume average particle index of the phosphor.

FIG. 13 is a graph showing a relationship between a firing temperature of a phosphor and a volume average particle index of the phosphor. In FIG. 13, a horizontal axis indicates the firing temperature, and a vertical axis indicates the volume average particle distribution index (PSDv) of the phosphor. In FIGS. 12 and 13, diamond-shaped points indicate Examples 1 to Example 13, and a rectangular point b indicates Comparative Example 4.

Referring to FIG. 11 and Table 1, Comparative Example 3 has a firing temperature of 1150° C. during a firing process, and a nitride is not synthesized. In other words, a phosphor is not obtained because the firing temperature is too low. In addition, when the firing temperature is too low, an impurity such as a silicon-containing compound and other impurities is increased, and thus an internal quantum efficiency at an excitation wavelength of 450 nm is deteriorated.

On the other hand, referring to FIG. 11 and Table 1, Comparative Example 4 has a firing temperature of 1650° C. during a firing process, and as shown in FIG. 12 and Table 2, an overgrown phosphor particle having a greater than 400 nm of a volume average particle diameter (D50v) is obtained. In other words, when the firing temperature is too high, a phosphor having a desired particle diameter is not obtained. In addition, referring to FIG. 13 and Table 2, since a particle distribution of the phosphor according to Comparative Example 4 is difficult to control, the phosphor has a volume average particle distribution index (PSDv) of greater than 1.35. As a result, a phosphor having a target particle distribution is not obtained. On the other hand, as shown in FIG. 11 and Table 1, Comparative Example 5 has a firing temperature of greater than 1650° C., and thus a melting point of a nitride synthesized during firing is lowered depending on a ratio of an alkaline-earth metal element (Sr, Ca) and Eu. In other words, as the firing temperature is increased, the phosphor precursor particle melts during the firing and a phosphor is not obtained.

Accordingly, the firing temperature should be in a range of 1150° C. to 1650° C. In addition, considering that the phosphors having a volume average particle diameter (D50v) of 50 nm to 400 nm and a volume average particle distribution index (PSDv) of 1.20 to 1.35 according to Examples 1 to 13 are fired at 1200° C. to 1600° C., a phosphor precursor particle should be fired at a temperature of 1200° C. to 1600° C.

As shown in Table 1, in Examples 1 to 13, the phosphor precursor particles are fired under a mixed gas atmosphere of hydrogen and nitrogen or under a mixed gas atmosphere of ammonia and nitrogen, enabling a phosphor having a nitride as a main component to be obtained. Specifically, the phosphors according to Examples 1 to 13 include a nitride of greater than or equal to 50 mass % for example, greater than or equal to 70 mass % based on a total mass of the nitride and the silicon-containing compound. When a phosphor includes a nitride as a main component, the phosphor has a high internal quantum efficiency at an excitation wavelength of 450 nm.

On the other hand, in Comparative Example 2 obtained by firing a phosphor precursor particle under a nitrogen gas atmosphere of 100 volume %, little nitride is synthesized, but a silicon-containing compound having the same crystal structure as a material represented by the formula $Sr_2SiO_4$ is mainly generated.

Accordingly, the firing should be performed under a mixed gas atmosphere of hydrogen and nitrogen or under a mixed gas atmosphere of ammonia and nitrogen.

In Comparative Example 10, raw materials are mixed in a mole ratio of 1:0.95 between a total mole amount of the alkaline-earth metal element and the activator element and a mole amount of the silicon, and in Comparative Example 11, the raw materials are mixed in a mole ratio of 1:1.65. In Comparative Examples 10 and 11, little nitride is synthesized, but in Comparative Example 10, a silicon-containing compound having the same crystal structure as a material represented by the formula $Sr_2SiO_4$ is mainly generated, and in Comparative Example 11, a silicon-containing compound having the same crystal structure as a material represented by the formula $SrSi_2O_2N_2$ is mainly generated.

Accordingly, the raw materials should be mixed in a mole ratio of a total mole amount of the alkaline-earth metal element and the activator element and a mole amount of the silicon within a range of 1:1 to 1:1.6. In addition, the phosphors according to Examples 1 to 13 include nitride of greater than or equal to 50 mass % based on a total mass of the nitride and the silicon-containing compound, and are obtained by mixing the raw materials in a mole ratio of 1:1 to 1:1.5, and thus the raw materials should be mixed in a mole ratio of 1:1.1 to 1:1.5.

Although only Sr or a mixture of Sr and Ca as an alkaline-earth metal element is used in the phosphors according to the Examples described above, phosphors according to the disclosure of this application are not limited thereto, but may include either one or both of Ba and Mg instead of Ca, or a mixture of either one or both of Ba and Mg with Ca.

In addition, although the phosphors according to the Examples described above use only Eu as the activator element, phosphors according to the disclosure of this application are not limited thereto, but may include a mixture of Eu and Ce.

In addition, although the phosphors according to the Examples described above were produced using a co-precipitation method as a wet chemical process, phosphors according to the disclosure of this application are not limited thereto, but may use a citrate method, or may use both the co-precipitation method and the citrate method.

Furthermore, although the phosphors according to the Examples described above include a carbonate salt of an alkaline-earth metal element and a hydroxide of an activator element deposited on the surface of a silicon nitride particle, phosphors according to the disclosure of this application are not limited thereto, but may instead include a hydrogen carbonate salt, a phosphate salt, an oxalate salt, a sulfate, or an organometallic compound of the alkaline-earth metal element or the activator element deposited on the surface of the silicon nitride particle.

A method of forming a nitride phosphor or an oxynitride phosphor containing an alkaline-earth metal element having a small particle diameter and a silicon is disclosed in JP 2007-314726 A, which includes adding a solvent to a phosphor precursor powder consisting of a mixture of a raw phosphor powder having an average particle diameter of less than or equal to 50 nm to prepare a slurry, adding an organic binder thereto, and drying the resulting slurry to obtain a particulate having a particle diameter of less than or equal to 2 μm. Then, the particulate is fired to obtain a desired phosphor.

However, the method disclosed in JP 2007-314726 A cannot synthesize a phosphor particle having a small particle diameter, because the particulate having a particle diameter of less than or equal to 2 μm formed through spray-drying as a phosphor precursor powder is sintered during firing. In addition, since the particulate having a particle diameter of less than or equal to 2 μm and the organic binder are used, carbon not removed through the firing process deteriorates the photoluminescence characteristics of the phosphor. Furthermore, since a compound of an activator element such as Eu and a compound of an alkaline-earth metal element providing a substitution site for the activator element are used as separate raw materials, the Eu may not be sufficiently dispersed into the site of the alkaline-earth metal element through the firing. As a result, the luminous efficiency of the obtained phosphor may be deteriorated.

A method of forming a metal silicon nitride phosphor or a metal silicon oxynitride phosphor disclosed in JP 2011-515536 A corresponding to US 2011/0135928 A1 forms a precursor particle mixture consisting of phosphor raw materials. At least one of the precursor particles has a smaller average primary particle size than 100 nm. The precursor particle having a smaller average primary particle size than 100 nm may be, for example, a silicon nitride particle. Then, this mixture is fired to obtain a desired phosphor through a solid-phase reaction.

However, the phosphor obtained by firing the precursor particle mixture using the method disclosed in JP 2011-515536 A may be a deposit of a silicon nitride particle and a silicon oxynitride particle and thus may not be synthesized to have a small particle diameter due to adhesion of the primary particles and other factors. In addition, since a compound of an activator element such as Eu and a compound of an alkaline-earth metal element are separately used like in JP 2007-314726 A, the Eu may not be sufficiently dispersed before a sub-micron particle size is obtained, and thus the luminous efficiency of the obtained phosphor may be deteriorated.

However, the manufacturing method described in the disclosure of this application provides a phosphor having an excellent luminous efficiency itself and simultaneously a sub-micron size average particle diameter. The phosphor mainly includes an alkaline-earth metal element and a silicon-containing nitride, and thus maximizes the nephelauxetic effect. Accordingly, the sub-micron sized phosphor according to the Examples described above may be used to provide a lighting device having a high performance.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A phosphor comprising a nitride, the nitride comprising an alkaline-earth metal element, silicon, and an activator element;
    wherein the phosphor has a volume average particle diameter ranging from about 50 nm to about 400 nm, and an internal quantum efficiency of greater than or equal to about 60% at an excitation wavelength of 450 nm;
    the nitride is represented by a formula $M_2Si_5N_8$;
    the M comprises:
        one or more alkaline-earth metal element selected from Ca, Sr, Ba, and Mg and comprising at least Sr; and
        one or more activator element selected from Eu and Ce and comprising at least Eu;
    an amount of the Sr included in the phosphor is about 15 mol % to about 99 mol % based on total moles of the M; and
    an amount of the activator element included in the phosphor is about 1 mol % to 20 mol % based on the total moles of the M.

2. The phosphor of claim 1, wherein the nitride has a same crystal structure as a material represented by a formula $Sr_2Si_5N_8$.

3. The phosphor of claim 2, wherein the phosphor further comprises a silicon-containing compound having a crystal structure that is different from the crystal structure of the nitride; and
    an amount of the nitride included in the phosphor is greater than or equal to about 50 mass % based on a sum of a mass of the nitride and a mass of the silicon-containing compound.

4. The phosphor of claim 1, wherein the phosphor has a volume average particle distribution index ranging from about 1.20 to about 1.35.

5. The phosphor of claim 1, wherein the phosphor has a volume average particle diameter ranging from about 100 nm to about 300 nm.

6. The phosphor of claim 1, wherein the phosphor has an internal quantum efficiency of greater than or equal to about 70% at an excitation wavelength of 450 nm.

7. The phosphor of claim 3, wherein the amount of the silicon-containing compound included in the phosphor is less than or equal to about 30 mass % based on a sum of a mass of the nitride and a mass of the silicon-containing compound.

8. A phosphor comprising a nitride, the nitride comprising an alkaline-earth metal element, silicon, and an activator element;
   wherein the phosphor has a volume average particle diameter ranging from about 50 nm to about 400 nm, and an internal quantum efficiency of greater than or equal to about 60% at an excitation wavelength of 450 nm, and a volume average particle distribution index ranging from about 1.20 to about 1.35;
   the nitride is represented by a formula $M_2Si_5N_8$;
   wherein the M comprises:
      one or more alkaline-earth metal element selected from Ca, Sr, Ba, and Mg and comprising at least Sr; and
      one or more activator element selected from Eu and Ce and comprising at least Eu;
   and the nitride has a same crystal structure as a material represented by a formula $Sr_2Si_5N_8$.

* * * * *